United States Patent
Yamanashi et al.

(10) Patent No.: US 9,076,434 B2
(45) Date of Patent: Jul. 7, 2015

(54) DECODING AND ENCODING APPARATUS AND METHOD FOR EFFICIENTLY ENCODING SPECTRAL DATA IN A HIGH-FREQUENCY PORTION BASED ON SPECTRAL DATA IN A LOW-FREQUENCY PORTION OF A WIDEBAND SIGNAL

(75) Inventors: Tomofumi Yamanashi, Kanagawa (JP); Masahiro Oshikiri, Kanagawa (JP)

(73) Assignee: PANASONIC INTELLECTUAL PROPERTY CORPORATION OF AMERICA, Torrance, CA (US)

( * ) Notice: Subject to any disclaimer, the term of this patent is extended or adjusted under 35 U.S.C. 154(b) by 177 days.

(21) Appl. No.: 13/703,491

(22) PCT Filed: Jun. 7, 2011

(86) PCT No.: PCT/JP2011/003196
§ 371 (c)(1),
(2), (4) Date: Dec. 11, 2012

(87) PCT Pub. No.: WO2011/161886
PCT Pub. Date: Dec. 29, 2011

(65) Prior Publication Data
US 2013/0124201 A1 May 16, 2013

(30) Foreign Application Priority Data

Jun. 21, 2010 (JP) .................................. 2010-141021
Mar. 4, 2011 (JP) .................................. 2011-047597

(51) Int. Cl.
*G10L 19/008* (2013.01)
*G10L 19/24* (2013.01)
(Continued)

(52) U.S. Cl.
CPC ............ *G10L 19/008* (2013.01); *G10L 19/0212* (2013.01); *G10L 19/24* (2013.01); *H03G 3/20* (2013.01); *G10L 19/18* (2013.01); *G10L 21/038* (2013.01)

(58) Field of Classification Search
CPC .................................................. G10L 19/0208
USPC ......................................................... 704/225, 500
See application file for complete search history.

(56) References Cited

U.S. PATENT DOCUMENTS 7,983,904 B2 * 7/2011 Ehara et al. .................... 704/205
7,996,233 B2 8/2011 Oshikiri
(Continued)

FOREIGN PATENT DOCUMENTS

EP 1533789 5/2005
EP 2402940 1/2012
(Continued)

OTHER PUBLICATIONS

Search report from E.P.O., mail date is Oct. 18, 2013.
(Continued)

*Primary Examiner* — Susan McFadden
(74) *Attorney, Agent, or Firm* — Greenblum & Bernstein, P.L.C.

(57) ABSTRACT

A decoding device which can efficiently encode/decode spectral data in a high pass section of a broadband signal. In the device, a sample group extraction unit partially selects spectral components by means of an ease of selection importance which is the extent that the spectral components come close to the spectral component having the maximum amplitude value, in the spectrum of a high pass estimated by means of first parameters contained in second encoded information and bands most approximated to each of the spectrums of a plurality of sub-bands calculated from the spectrum of a second decode signal; a logarithmic gain application unit applies second parameters to the partially selected spectral components; and an interpolation processing unit applies third parameters which are adaptively set according to the value of the second parameters, to the spectral components which were not partially selected.

21 Claims, 18 Drawing Sheets

(51) Int. Cl.
*H03G 3/20* (2006.01)
*G10L 21/038* (2013.01)
*G10L 19/02* (2013.01)
*G10L 19/18* (2013.01)

(56) References Cited

U.S. PATENT DOCUMENTS

| | | | |
|---|---|---|---|
| 8,452,588 B2 * | 5/2013 | Yamanashi et al. | 704/207 |
| 8,935,161 B2 * | 1/2015 | Oshikiri et al. | 704/230 |
| 2005/0252361 A1 | 11/2005 | Oshikiri | |
| 2007/0011002 A1 | 1/2007 | Chinen et al. | |
| 2008/0027733 A1 | 1/2008 | Oshikiri et al. | |
| 2009/0271204 A1 | 10/2009 | Tammi | |
| 2010/0274558 A1 | 10/2010 | Yamanashi et al. | |
| 2010/0280833 A1 | 11/2010 | Yamanashi et al. | |
| 2010/0284455 A1 | 11/2010 | Yamanashi et al. | |
| 2010/0332221 A1 | 12/2010 | Yamanashi et al. | |
| 2011/0307248 A1 | 12/2011 | Yamanashi et al. | |
| 2012/0158411 A1 | 6/2012 | Chinen et al. | |
| 2012/0209597 A1 | 8/2012 | Yamanashi | |
| 2012/0215527 A1 | 8/2012 | Yamanashi et al. | |
| 2013/0035943 A1 | 2/2013 | Yamanashi et al. | |

FOREIGN PATENT DOCUMENTS

| | | |
|---|---|---|
| JP | 2007-17908 | 1/2007 |
| WO | 2005/111568 | 11/2005 |
| WO | 2007/052088 | 5/2007 |
| WO | 2010/098112 | 9/2010 |

OTHER PUBLICATIONS

ISR dated Sep. 6, 2011.

* cited by examiner

DECODING AND ENCODING APPARATUS AND METHOD FOR EFFICIENTLY ENCODING SPECTRAL DATA IN A HIGH-FREQUENCY PORTION BASED ON SPECTRAL DATA IN A LOW-FREQUENCY PORTION OF A WIDEBAND SIGNAL

TECHNICAL FIELD

The claimed invention relates to a decoding apparatus, an encoding apparatus, a decoding method and an encoding method that are used in a communication system encoding and transmitting a signal.

BACKGROUND ART

For transmitting a speech or audio signal in a packet communication system represented by an Internet communication or a mobile communication system and/or the like, compression/encoding techniques are widely used to improve transmission efficiency of the speech or audio signal. Furthermore, in recent years, although speech or audio signals are simply encoded at a low bit rate, there is a growing demand for a technique for encoding a wider band speech/audio signal.

In response to such a demand, various techniques for encoding a wide band speech or audio signal without drastically increasing the amount of encoded information are being developed. According to a technique disclosed in Patent Literature 1, and/or the like, an encoding apparatus calculates parameters to generate a spectrum of a high-frequency portion of a frequency of spectral data obtained by converting input acoustic signals corresponding to a certain time and outputs the parameters together with encoded information of a low-frequency portion. More specifically, the encoding apparatus divides the spectral data of the high-frequency portion of the frequency into a plurality of subbands and calculates in each subband, a parameter that identifies a spectrum of the low-frequency portion most approximate to the spectrum of the subband. Next, the encoding apparatus adjusts the spectrum of the most approximate low-frequency portion using two types of scaling factors so that the peak amplitude in the high-frequency spectrum generated or energy of the subband (hereinafter, referred to as "subband energy") and the shape thereof become close to the peak amplitude, subband energy and shape of the spectrum of the high-frequency portion of a target input signal.

CITATION LIST

Patent Literature

PTL 1
International Publication WO2007/052088

SUMMARY OF INVENTION

Technical Problem

However, according to above-described Patent Literature 1, when combining high-frequency spectra, the encoding apparatus performs logarithmic transform on all samples (i.e., Modified Discrete Cosine Transform (MDCT) coefficients) of spectral data of an input signal and combined high-frequency spectral data. The encoding apparatus calculates parameters so that the subband energy and shape become close to the peak amplitude, subband energy and shape of the spectrum of the high-frequency portion of the target input signal. For this reason, there arises a problem that the amount of calculation of the encoding apparatus is considerably large. Furthermore, the decoding apparatus applies the calculated parameters to all samples in the subband without taking into consideration the magnitudes of amplitude of individual samples. Accordingly, the amount of calculation in the decoding apparatus for generating a high-frequency spectrum using the calculated parameters is very large, and the quality of the decoded speech thus generated is insufficient, and abnormal sound may also be produced in some instances.

It is an object of the claimed invention to provide a decoding apparatus, an encoding apparatus, a decoding method and an encoding method that are capable of efficiently encoding spectral data in a high-frequency portion based on spectral data in a low-frequency portion of a wide band signal and thereby improving quality of a decoded signal.

Solution to Problem

A decoding apparatus according to a first aspect of the claimed invention is a decoding apparatus that adopts a configuration including: a receiving section that receives first encoded information indicating a low-frequency portion no greater than a predetermined frequency of a speech signal or an audio signal, band information for estimating a spectrum of a high-frequency portion higher than the predetermined frequency of the speech signal or the audio signal in a plurality of subbands obtained by dividing the high-frequency portion, and second encoded information containing a first amplitude adjusting parameter that adjusts the amplitude corresponding to a part or all of spectral components in each subband; a first decoding section that decodes the first encoded information to generate a first decoded signal; and a second decoding section that estimates the high-frequency portion of the speech signal or the audio signal from the first decoded signal using the second encoded information and adjusts the amplitude of the spectral component to thereby generate a second decoded signal, in which the second decoding section includes: a spectral component selection section that selects a part of the spectral components for the spectrum of the estimated high-frequency portion of the speech signal or the audio signal; a first amplitude adjusting parameter application section that applies a second amplitude adjusting parameter to the selected part of the spectral components; and a second amplitude adjusting parameter application section that applies a third amplitude adjusting parameter adaptively set in accordance with the value of the second amplitude adjusting parameter for the spectral component that has not been selected.

An encoding apparatus according to a second aspect of the claimed invention is an encoding apparatus that adopts a configuration including: a first encoding section that encodes a low-frequency portion no greater than a predetermined frequency of an input signal to generate first encoded information; a decoding section that decodes the first encoded information to generate a first decoded signal; a second encoding section that generates second encoded information containing band information for estimating a spectrum of a high-frequency portion higher than the predetermined frequency of the input signal in a plurality of subbands obtained by dividing the high-frequency portion and a first amplitude adjusting parameter that adjusts the amplitude corresponding to a part or all of spectral components in each subband; a second decoding section that estimates the high-frequency portion of the input signal from the first decoded signal using the second encoded information and adjusts the amplitude of the spectral component to thereby generate a second decoded signal; and a third encoding section that encodes a difference signal between the first decoded signal and the second decoded signal, and the input signal to generate third encoded information, in which the second decoding section includes: a spectral component selection section that selects a part of the spectral components for the spectrum of the estimated high-frequency portion of the input signal; a first amplitude adjusting parameter application section that applies a second amplitude adjusting parameter to the selected part of the spectral components; and a second amplitude adjusting parameter application section that applies a third amplitude adjusting parameter adaptively set in accordance with the value of the second amplitude adjusting parameter to a part of the spectral components that has not been selected.

A decoding method according to a third aspect of the claimed invention adopts a configuration including: a receiving step of receiving first encoded information indicating a low-frequency portion no greater than a predetermined frequency of a speech signal or an audio signal, band information for estimating a spectrum of a high-frequency portion higher than the predetermined frequency of the speech signal or the audio signal in a plurality of subbands obtained by dividing the high-frequency portion, and second encoded information containing a first amplitude adjusting parameter that adjusts the amplitude corresponding to a part or all of spectral components in each subband; a first decoding step of decoding the first encoded information to generate a first decoded signal; and a second decoding step of estimating the high-frequency portion of the speech signal or the audio signal from the first decoded signal using the second encoded information and adjusting the amplitude of the spectral component to thereby generate a second decoded signal, in which the second decoding step includes: a spectral component selecting step of selecting a part of the spectral components for the spectrum of the estimated high-frequency portion of the speech signal or the audio signal; a first amplitude adjusting parameter applying step of applying a second amplitude adjusting parameter to the selected part of the spectral components; and a second amplitude adjusting parameter applying step of applying a third amplitude adjusting parameter adaptively set in accordance with the value of the second amplitude adjusting parameter for a part of the spectral components that has not been selected.

An encoding method according to a fourth aspect of the claimed invention adopts a configuration including: a first encoding step of encoding a low-frequency portion no greater than a predetermined frequency of an input signal to generate first encoded information; a decoding step of decoding the first encoded information to generate a first decoded signal; a second encoding step of generating second encoded information containing band information for estimating a spectrum of a high-frequency portion higher than the predetermined frequency of the input signal in a plurality of subbands obtained by dividing the high-frequency portion and a first amplitude adjusting parameter that adjusts the amplitude corresponding to a part or all of spectral components in each subband; a second decoding step of estimating the high-frequency portion of the input signal from the first decoded signal using the second encoded information and adjusting the amplitude of the spectral component to thereby generate a second decoded signal; and a third encoding step of encoding a difference signal between the first decoded signal and the second decoded signal, and the input signal to generate third encoded information, in which the second decoding step includes: a spectral component selecting step of selecting a part of the spectral components for the spectrum of the estimated high-frequency portion of the input signal; a first amplitude adjusting parameter applying step of applying a second amplitude adjusting parameter to the selected part of the spectral components; and a second amplitude adjusting parameter applying step of applying a third amplitude adjusting parameter adaptively set in accordance with the value of the second amplitude adjusting parameter to a part of the spectral component that has not been selected.

Advantageous Effects of Invention

According to the claimed invention, it is possible to efficiently encode/decode spectral data of a high-frequency portion of a wide band signal, realize a drastic reduction of the amount of calculation processing and improve the quality of the decoded signal.

DESCRIPTION OF EMBODIMENTS

According to the claimed invention, when generating spectral data of a high-frequency portion of a signal to be encoded based on spectral data of a low-frequency portion, an encoding apparatus calculates subband energy and shape adjusting parameters for a sample group extracted based on the position of a sample having a maximum amplitude in the subband. Furthermore, a decoding apparatus applies the parameters to the sample group extracted based on the sample position where amplitude is a maximum in the subband. Thus, it is possible to efficiently encode/decode spectral data in the high-frequency portion of a wide band signal, realize a drastic reduction of the amount of calculation processing, and also improve the quality of the decoded signal.

Hereinafter, embodiments of the claimed invention will be described in detail with reference to the accompanying drawings. Suppose the encoding apparatus and the decoding apparatus according to the claimed invention target any of a speech signal, an audio signal and a combination thereof as an input signal/output signal. Each embodiment of the claimed invention will describe a speech encoding apparatus and a speech decoding apparatus as examples.

Embodiment 1

Figure 1:
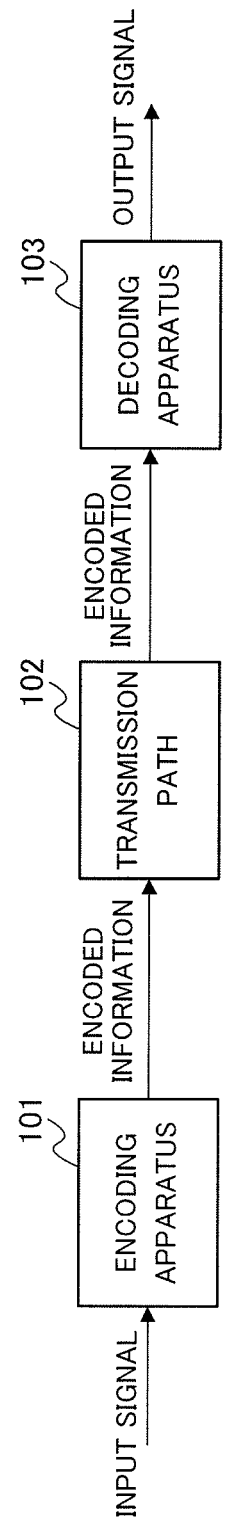
FIG. 1 is a block diagram showing a configuration of a communication system including an encoding apparatus and a decoding apparatus according to Embodiment 1 of the claimed invention.

FIG. 1 is a block diagram showing a configuration of a communication system including the encoding apparatus and the decoding apparatus according to the present embodiment. In FIG. 1, the communication system is provided with encoding apparatus 101 and decoding apparatus 103, each of which can communicate with each other via transmission path 102. Both encoding apparatus 101 and decoding apparatus 103 are usually used while installed on a base station apparatus or communication terminal apparatus and/or the like.

Encoding apparatus 101 divides an input signal into blocks of N samples (N is a natural number) and performs encoding for each frame including N samples.

Let us suppose that an input signal to be encoded is expressed by $x_n$ (n=0, . . . , N−1), where n denotes an (n+1)th signal element of the input signal divided into N-sample blocks. Encoding apparatus 101 transmits the encoded input information (i.e., encoded information) to decoding apparatus 103 via transmission path 102.

Decoding apparatus 103 receives the encoded information transmitted from encoding apparatus 101 via transmission path 102 and decodes the encoded information to obtain an output signal.

Figure 2:
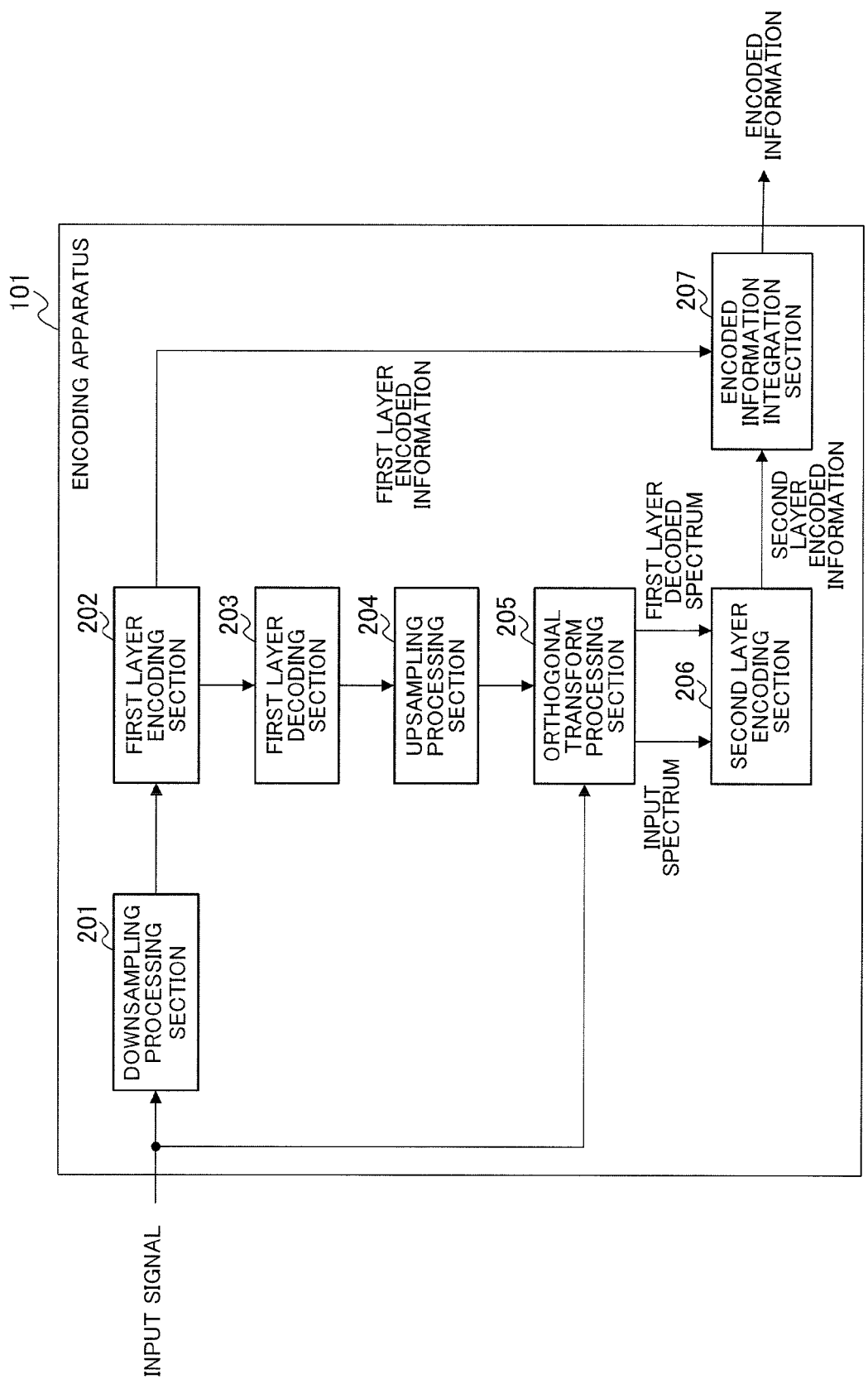
FIG. 2 is a block diagram showing a principal internal configuration of the encoding apparatus shown in FIG. 1 according to Embodiment 1 of the claimed invention.

FIG. 2 is a block diagram showing a principal internal configuration of encoding apparatus 101 shown in FIG. 1. Assuming that a sampling frequency of the input signal is $SR_1$, downsampling processing section 201 downsamples the sampling frequency of the input signal from $SR_1$ to $SR_2$ ($SR_2 < SR_1$), and outputs the downsampled input signal to first layer encoding section 202 as an input signal after the downsampling. Hereinafter, a case will be described as an example where $SR_2$ is a sampling frequency of ½ of $SR_1$.

First layer encoding section 202 encodes the downsampled input signal inputted from downsampling processing section 201 using a Code Excited Linear Prediction (CELP) speech encoding method and/or the like to generate first layer encoded information. More specifically, first layer encoding section 202 encodes a low-frequency portion no greater than a predetermined frequency of the input signal to generate first layer encoded information. First layer encoding section 202 then outputs the generated first layer encoded information to first layer decoding section 203 and encoded information integration section 207.

First layer decoding section 203 decodes the first layer encoded information inputted from first layer encoding section 202 using a CELP speech decoding method and/or the like to generate a first layer decoded signal. First layer decoding section 203 then outputs the generated first layer decoded signal to upsampling processing section 204.

Upsampling processing section 204 upsamples a sampling frequency of the first layer decoded signal inputted from first layer decoding section 203 from $SR_2$ to $SR_1$ and outputs the upsampled first layer decoded signal to orthogonal transform processing section 205 as a first layer decoded signal after the upsampling.

Orthogonal transform processing section 205 includes buffers $buf1_n$ and $buf2_n$ (n=0, . . . , N−1) and applies modified discrete cosine transform (MDCT) to input signal $x_n$ and upsampled first layer decoded signal $y_n$ inputted from upsampling processing section 204.

Hereinafter, the orthogonal transform processing in orthogonal transform processing section 205 will be described focusing on its calculation procedure and data output to the internal buffers.

First, orthogonal transform processing section 205 initializes buffers $buf1_n$ and $buf2_n$ according to equation 1 and equation 2 below using "0" as the initial value, first.

[1]

$$buf1_n = 0 \ (n=0, \ldots, N-1) \quad \text{(Equation 1)}$$

[2]

$$buf2_n = 0 \ (n=0, \ldots, N-1) \quad \text{(Equation 2)}$$

Next, orthogonal transform processing section 205 applies MDCT coefficients to input signal $x_n$ and upsampled first layer decoded signal $y_n$ according to equation 3 and equation 4 below to obtain an MDCT coefficient (hereinafter, referred to as "input spectrum") $S2(k)$ of the input signal and an MDCT coefficient (hereinafter, referred to as "first layer decoded spectrum") $S1(k)$ of upsampled first layer decoded signal $y_n$.

(Equation 3)

$$S2(k) = \frac{2}{N} \sum_{n=0}^{2N-1} x'_n \cos\left[\frac{(2n+1+N)(2k+1)\pi}{4N}\right] \quad [3]$$

$$(k = 0, \ldots, N-1)$$

(Equation 4)

$$S1(k) = \frac{2}{N} \sum_{n=0}^{2N-1} y'_n \cos\left[\frac{(2n+1+N)(2k+1)\pi}{4N}\right] \quad [4]$$

$$(k = 0, \ldots, N-1)$$

In equations 3 and 4, k denotes an index of each sample in one frame. Orthogonal transform processing section 205 obtains $x_n'$ which is a vector combining input signal $x_n$ and buffer $buf1_n$ according to equation 5 below. Furthermore, orthogonal transform processing section 205 obtains $y_n'$ which is a vector combining first layer decoded signal $y_n$ after upsampling and buffer buf2$_n$ according to equation 6 below.

(Equation 5)

$$x'_n = \begin{cases} buf1_n & (n = 0, \ldots N-1) \\ x_{n-N} & (n = N, \ldots 2N-1) \end{cases} \quad [5]$$

(Equation 6)

$$y'_n = \begin{cases} buf2_n & (n = 0, \ldots N-1) \\ y_{n-N} & (n = N, \ldots 2N-1) \end{cases} \quad [6]$$

Next, orthogonal transform processing section 205 updates buffers buf1$_n$ and buf2$_n$ according to equation 7 and equation 8.

[7]

$$buf1_n = x_n \ (n=0,\ldots,N-1) \quad \text{(Equation 7)}$$

[8]

$$buf2_n = y_n \ (n=0,\ldots,N-1) \quad \text{(Equation 8)}$$

Orthogonal transform processing section 205 then outputs input spectrum S2(k) and first layer decoded spectrum S1(k) to second layer encoding section 206.

The orthogonal transform processing in orthogonal transform processing section 205 has been described so far.

Second layer encoding section 206 generates second layer encoded information using input spectrum S2(k) and first layer decoded spectrum S1(k) inputted from orthogonal transform processing section 205 and outputs the generated second layer encoded information to encoded information integration section 207. Details of second layer encoding section 206 will be described later.

Encoded information integration section 207 integrates the first layer encoded information inputted from first layer encoding section 202 and the second layer encoded information inputted from second layer encoding section 206, adds a transmission error code and/or the like to the integrated information source code if necessary, and outputs the resultant information to transmission path 102 as encoded information.

Next, a principal internal configuration of second layer encoding section 206 shown in FIG. 2 will be described using FIG. 3.

Second layer encoding section 206 is provided with band dividing section 260, filter state setting section 261, filtering section 262, searching section 263, pitch coefficient setting section 264, gain encoding section 265 and multiplexing section 266, and the respective sections perform the following operations.

Band dividing section 260 divides a high-frequency portion (FL≤k<FH) higher than a predetermined frequency of input spectrum S2(k) inputted from orthogonal transform processing section 205 into P (where, P is an integer greater than 1) subbands SB$_p$ (p=0, 1, . . . , P−1). Band dividing section 260 outputs bandwidth BW$_p$ (p=0, 1, . . . , P−1) of each subband obtained by division and start index (that is, start position of the subband) BS$_p$ (p=0, 1, . . . , P−1) (FL≤BS$_p$<FH) to filtering section 262, searching section 263 and multiplexing section 266 as band division information (i.e., information for estimating a spectrum of the high-frequency portion of the input signal in a plurality of subbands obtained by dividing the high-frequency portion higher than a predetermined frequency of the input signal). Hereinafter, the portion of input spectrum S2(k) that corresponds to subband SB$_p$ will be described as subband spectrum S2$_p$(k) (BS$_p$≤k<BS$_p$+BW$_p$).

Filter state setting section 261 sets first layer decoded spectrum S1(k) (0≤k<FL) inputted from orthogonal transform processing section 205 as a filter state used in filtering section 262. That is, first layer decoded spectrum S1(k) is stored in the 0≤k<FL band of spectrum S(k) of the full frequency band 0≤k<FH in filtering section 262 as an internal state of the filter (filter state).

Filtering section 262 is provided with a multi-tap pitch filter, filters the first layer decoded spectrum based on the filter state set by filter state setting section 261, pitch coefficients inputted from pitch coefficient setting section 264 and band division information inputted from band dividing section 260, and calculates estimate value S2$_p$'(k) of each subband SB$_p$ (p=0, 1, . . . , P−1) (BS$_p$≤k<BS$_p$+BW$_p$) (p=0, 1, . . . , P−1) (hereinafter, referred to as "estimated spectrum of subband SB$_p$"). Filtering section 262 outputs estimated spectrum S2$_p$'(k) of subband SB$_p$ to searching section 263. Details of the filtering processing in filtering section 262 will be described, hereinafter. Let us suppose the number of taps of the multi-tap may be an optional value (integer) equal to or above 1.

Searching section 263 calculates similarity between estimated spectrum S2$_p$'(k) of subband SB$_p$ inputted from filtering section 262 and each subband spectrum S2$_p$(k) in a high-frequency portion (FL≤k<FH) of input spectrum S2(k) inputted from orthogonal transform processing section 205 based on the band division information inputted from band dividing section 260. This similarity calculation is performed through correlation calculation, and/or the like. Furthermore, the processing performed by filtering section 262, searching section 263 and pitch coefficient setting section 264 forms search processing on a closed loop for each subband, and in each closed loop, searching section 263 changes pitch coefficient T inputted from pitch coefficient setting section 264 to filtering section 262 in various ways to thereby calculate a similarity corresponding to each pitch coefficient. Searching section 263 obtains optimum pitch coefficient T$_p$' (within a range of Tmin to Tmax), and/or the like, corresponding to a maximum similarity in the closed loop corresponding to subband SB$_p$ in the closed loop for each subband and outputs P optimum pitch coefficients to multiplexing section 266. Details of the similarity calculation method in searching section 263 will be described, hereinafter.

Searching section 263 calculates part of the band of the first layer decoded spectrum similar to each subband SB$_p$ (i.e., the band most approximate to the spectrum of each subband) using each optimum pitch coefficient T$_p$'. Furthermore, searching section 263 outputs to gain encoding section 265, estimated spectrum S2$_p$'(k) corresponding to each optimum pitch coefficient T$_p$' (p=0, 1, . . . , P−1) and ideal gain α1$_p$ which is an amplitude adjusting parameter calculated according to equation 9 when optimum pitch coefficient T$_p$' (p=0, 1, . . . , P−1) is calculated. In equation 9, M' denotes the number of samples when calculating similarity D, which may be any value no greater than the bandwidth of each subband. Details of the search processing on optimum pitch coefficient T$_p$' (p=0, 1, . . . , P−1) in searching section 263 will be described, hereinafter.

(Equation 9)

$$\alpha 1_p = \frac{\sum_{k=0}^{M'} S2(BS_p + k) \cdot S2'(BS_p + k)}{\sum_{k=0}^{M'} S2'(BS_p + k) \cdot S2'(BS_p + k)} \quad [9]$$

$$\begin{pmatrix} p = 0, \ldots, P-1 \\ 0 < M' \leq BW_i \end{pmatrix}$$

Pitch coefficient setting section 264 sequentially outputs pitch coefficient T to filtering section 262 while changing pitch coefficient T little by little within a predetermined search range of Tmin to Tmax, together with filtering section 262 and searching section 263 under the control of searching section 263. When performing search processing on a closed loop corresponding to a first subband and/or the like, pitch coefficient setting section 264 may set pitch coefficient T while changing pitch coefficient T little by little within a predetermined search range of Tmin to Tmax, whereas when performing search processing on a closed loop corresponding to an m-th (m=2, 3, . . . , P) subband from a second subband and the following subbands, pitch coefficient setting section 264 may set pitch coefficient T while changing pitch coefficient T little by little based on an optimum pitch coefficient obtained in the search processing on a closed loop corresponding to an (m−1)-th subband.

Gain encoding section 265 calculates a logarithmic gain which is a parameter for adjusting an energy ratio in a non-linear region for each subband based on input spectrum $S2(k)$, and estimated spectrum $S2_p'(k)$ (p=0, 1, . . . , P−1) of each subband and ideal gain $\alpha 1_p$ inputted from searching section 263. Next, gain encoding section 265 quantizes the ideal gain and logarithmic gain, and outputs the quantized ideal gain and logarithmic gain to multiplexing section 266.

Figure 4:
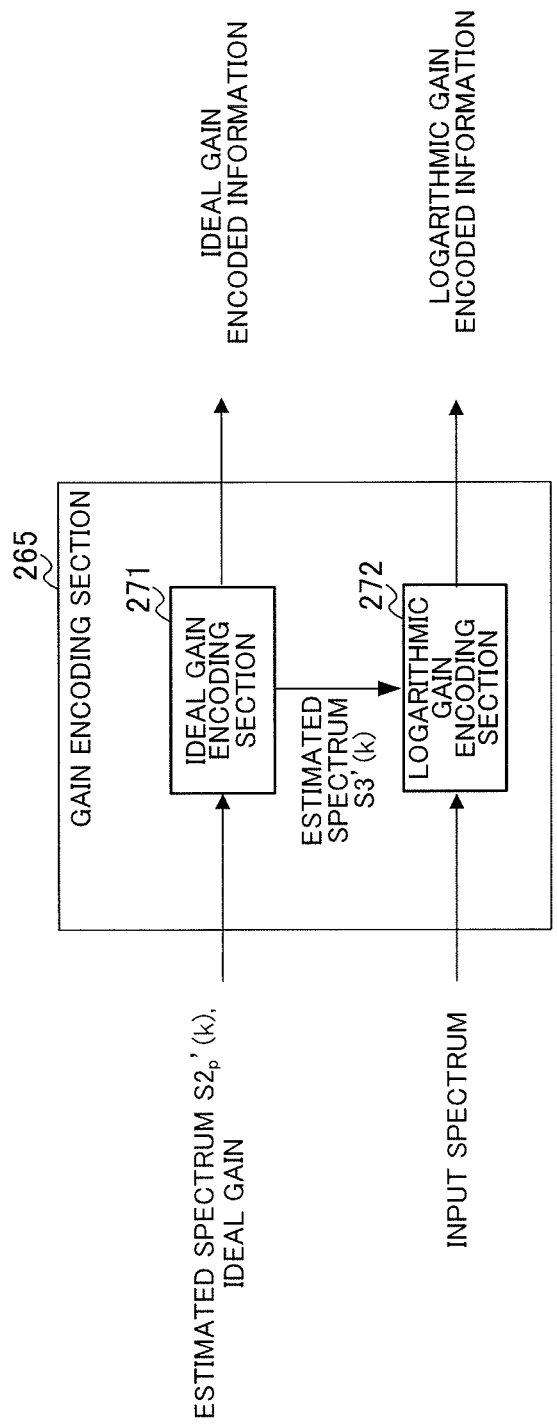
FIG. 4 is a block diagram showing a principal configuration of the gain encoding section shown in FIG. 3 according to Embodiment 1 of the claimed invention.

FIG. 4 is a diagram showing an internal configuration of gain encoding section 265. Gain encoding section 265 is mainly constructed of ideal gain encoding section 271 and logarithmic gain encoding section 272.

Ideal gain encoding section 271 makes estimated spectrum $S2_p'(k)$ (p=0, 1, . . . , P−1) in each subband inputted from searching section 263 continuous in a frequency domain to form estimated spectrum $S2'(k)$ of a high-frequency portion of the input spectrum. Next, ideal gain encoding section 271 multiplies estimated spectrum $S2'(k)$ by ideal gain $\alpha 1_p$ for each subband inputted from searching section 263 according to equation 10 to calculate estimated spectrum $S3'(k)$. In equation 10, $BL_p$ denotes a start index of each subband and $BH_p$ denotes an end index of each subband. Ideal gain encoding section 271 outputs calculated estimated spectrum $S3'(k)$ to logarithmic gain encoding section 272. Furthermore, ideal gain encoding section 271 quantizes ideal gain $\alpha 1_p$ and outputs quantized ideal gain $\alpha 1Q_p$ to multiplexing section 266 as ideal gain encoded information.

$$S3'(k)=S2'(k)\cdot\alpha 1_p \quad (BL_p \leq k \leq BH_p, \text{ for all } p) \quad \text{(Equation 10)}$$

Logarithmic gain encoding section 272 calculates a logarithmic gain which is a parameter (that is, an amplitude adjusting parameter) for adjusting an energy ratio in the non-linear region per subband between the high-frequency portion (FL≤k<FH) of input spectrum $S2(k)$ inputted from orthogonal transform processing section 205 and estimated spectrum $S3'(k)$ inputted from ideal gain encoding section 271 and outputs the calculated logarithmic gain to multiplexing section 266 as logarithmic gain encoded information.

Figure 5:
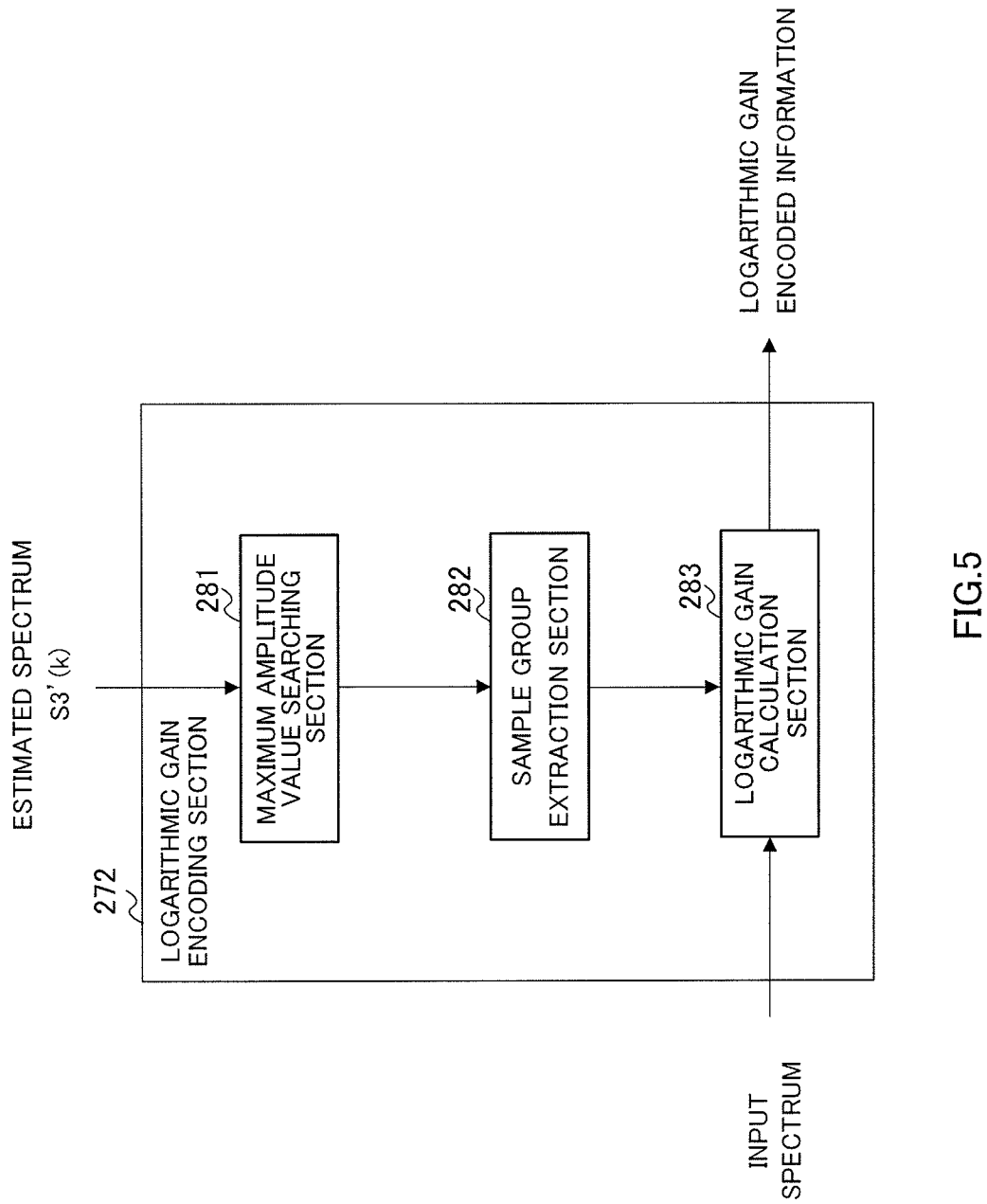
FIG. 5 is a block diagram showing a principal configuration of the logarithmic gain encoding section shown in FIG. 4 according to Embodiment 1 of the claimed invention.

FIG. 5 shows an internal configuration of logarithmic gain encoding section 272. Logarithmic gain encoding section 272 is mainly constructed of maximum amplitude value searching section 281, sample group extraction section 282 and logarithmic gain calculation section 283.

Maximum amplitude value searching section 281 searches for maximum amplitude value $MaxValue_p$ in a logarithmic region and maximum amplitude index $MaxIndex_p$ which is an index of a sample (spectral component) having maximum amplitude for each subband with respect to estimated spectrum $S3'(k)$ inputted from ideal gain encoding section 271 according to equation 11.

(Equation 11)

$$\begin{cases} MaxValue_p = \max(\log_{10}|S3'(k)|) \\ MaxIndex_p = k \text{ where } MaxValue_p = \log_{10}|S3'(k)| \end{cases} \quad [11]$$

$(BL_p \leq k \leq BH_p (k = 0, 2, 4, 6, \ldots \text{ (even)}), \text{ for all } p)$ That is, maximum amplitude value searching section 281 searches for a maximum amplitude value in the logarithmic region for only the samples with indices that are even numbers. This allows the amount of calculation for searching the maximum amplitude value to be reduced efficiently.

Maximum amplitude value searching section 281 outputs estimated spectrum $S3'(k)$, maximum amplitude value $MaxValue_p$ and maximum amplitude index $MaxIndex_p$ to sample group extraction section 282.

Sample group extraction section 282 determines the value of extraction flag $SelectFlag(k)$ for each sample (spectral component) with respect to estimated spectrum $S3'(k)$ inputted from maximum amplitude value searching section 281 according to equation 12 below.

(Equation 12)

$$SelectFlag(k) = \begin{cases} 0 & k = 1, 3, 5, 7, 9, \ldots \text{ (odd)} \\ 1 & k = 0, 2, 4, 6, 8, \ldots \text{ (even)} \end{cases} \quad [12]$$

$(BL_p \leq k \leq BH_p, \text{ for all } p)$

That is, as shown in equation 12, sample group extraction section 282 sets the value of extraction flag $SelectFlag(k)$ to 0 for samples whose indices are odd numbers and sets the value of extraction flag $SelectFlag(k)$ to 1 for samples whose indices are even numbers. That is, sample group extraction section 282 selects a part of samples (spectral components) (here only samples having indices that are even numbers) for estimated spectrum $S3'(k)$. Sample group extraction section 282 outputs extraction flag $SelectFlag(k)$, estimated spectrum $S3'(k)$ and maximum amplitude value $MaxValue_p$ to logarithmic gain calculation section 283.

Logarithmic gain calculation section 283 calculates energy ratio (logarithmic gain) $\alpha 2_p$ between estimated spectrum $S3'(k)$ and input spectrum $S2(k)$ in the logarithmic region of the high-frequency portion (FL≤k<FH) for samples having value of extraction flag $SelectFlag(k)$ inputted from sample group extraction section 282 is 1 according to equation 13. That is, logarithmic gain calculation section 283 calculates logarithmic gain $\alpha 2_p$ for only the part of the samples selected by sample group extraction section 282.

(Equation 13)

$$\alpha 2_p = \frac{\sum_{k=0}^{M'} (\log_{10}(|S2(BS_p + k)|) - MaxValue_p) \cdot (\log_{10}(|S3'(BS_p + k)|) - MaxValue_p)}{\sum_{k=0}^{M'} (\log_{10}(|S2(BS_p + k)|) - MaxValue_p) \cdot (\log_{10}(|S3'(BS_p + k)|) - MaxValue_p)} \quad [13]$$

$$\begin{pmatrix} \text{if } SelectFlag(k) = 1 \\ p = 0, \ldots, P-1 \\ 0 < M' \leq BW_i \end{pmatrix}$$

Logarithmic gain calculation section 283 then quantizes logarithmic gain $\alpha 2_p$ and outputs quantized logarithmic gain $\alpha 2Q_p$ to multiplexing section 266 as logarithmic gain encoded information.

The processing of gain encoding section 265 has been described.

Multiplexing section 266 multiplexes the band division information inputted from band dividing section 260, optimum pitch coefficient $T_p'$ for each subband $SB_p$ (p=0, 1, ..., P-1) inputted from searching section 263 and indices corresponding to ideal gain $\alpha 1 Q_p$ and logarithmic gain $\alpha 2 Q_p$ inputted from gain encoding section 265 (i.e., ideal gain encoded information and logarithmic gain encoded information, that is, parameters for adjusting the amplitude for some or all spectral components in each subband) as second layer encoded information and outputs the second layer encoded information to encoded information integration section 207. $T_p'$ and indices of $\alpha 1 Q_p$ and $\alpha 2 Q_p$ may be directly inputted to encoded information integration section 207 and encoded information integration section 207 may multiplex $T_p'$ and indices of $\alpha 1 Q_p$ and $\alpha 2 Q_p$ with the first layer encoded information.

Figure 6:
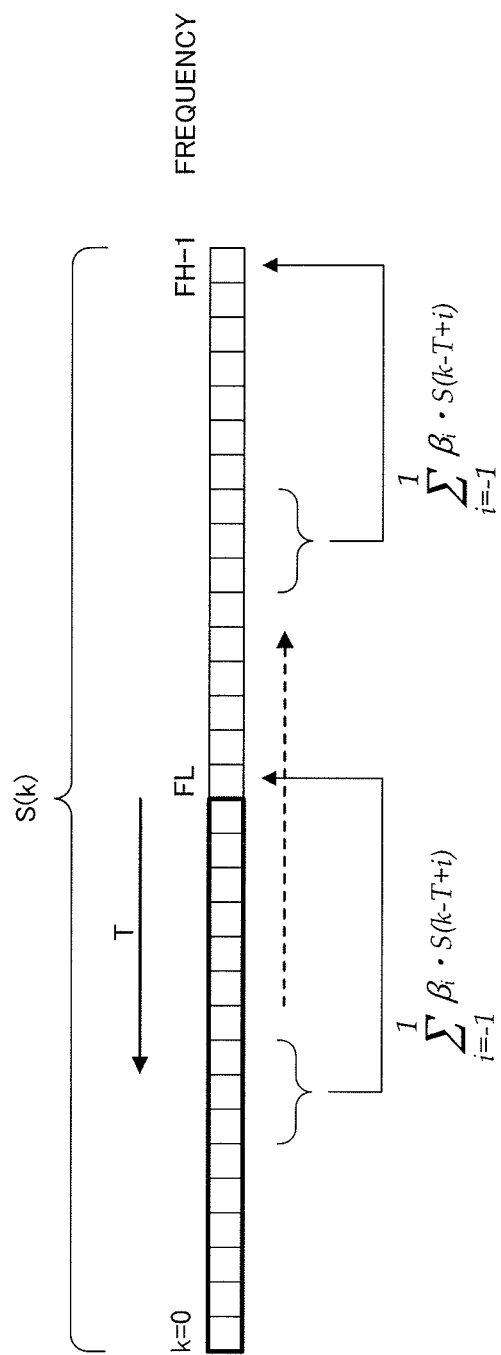
FIG. 6 is a diagram showing details of filtering processing in the filtering section according to Embodiment 1 of the claimed invention.

Next, details of the filtering processing in filtering section 262 shown in FIG. 3 will be described using FIG. 6.

Filtering section 262 generates an estimated spectrum in band $BS_p \leq k < BS_p + BW_p$ (p=0, 1, ..., P-1) for subband $SB_p$ (p=0, 1, ..., P-1) using the filter state inputted from filter state setting section 261, pitch coefficient T inputted from pitch coefficient setting section 264 and band division information inputted from band dividing section 260. Transfer function F(z) of a filter used in filtering section 262 is expressed by equation 14 below.

Hereinafter, the processing of generating estimated spectrum $S2_p'(k)$ of subband spectrum $S2_p(k)$ will be described using subband $SB_p$ as an example.

(Equation 14)

$$F(z) = \frac{1}{1 - \sum_{i=-M}^{M} \beta_i z^{-T+i}} \quad [14]$$

In equation 14, T denotes a pitch coefficient given from pitch coefficient setting section 264 and $\beta_i$ denotes a filter coefficient internally stored beforehand. For example, when the number of taps is 3, an example of filter coefficient candidates is $(\beta_{-1}, \beta_0, \beta_1)=(0.1, 0.8, 0.1)$. In addition, values $(\beta_{-1}, \beta_0, \beta_1)=(0.2, 0.6, 0.2)$, $(0.3, 0.4, 0.3)$ or the like are also appropriate as filter coefficient candidates. Furthermore, values $(\beta_{-1}, \beta_0, \beta_1)=(0.0, 1.0, 0.0)$ may also be filter coefficient candidates, which means in this case that part of the band of the first layer decoded spectrum of band $0 \leq k < FL$ is copied to the band of $BS_p \leq k < BS_p + BW_p$ as is without changing the shape thereof. A case where $(\beta_{-1}, \beta_0, \beta_1)=(0.0, 1.0, 0.0)$ will be described below as an example. Furthermore, let us suppose that M=1 in equation 14. M denotes an index regarding the number of taps.

First layer decoded spectrum $S1(k)$ is stored in a band of $0 \leq k < FL$ of spectrum $S(k)$ of the full frequency band in filtering section 262 as an internal state (i.e., filter state) of the filter.

Estimated spectrum $S2_p'(k)$ of subband $SB_p$ is stored in a band of $BS_p \leq k < BS_p + BW_p$ of $S(k)$ through filtering processing of the following procedure. That is, as shown in FIG. 6, spectrum $S(k-T)$ having a frequency lower than k by T is substituted into $S2_p'(k)$, basically. However, to increase the smoothness of the spectrum, spectrum $\beta_i \cdot S(k-T+i)$ obtained by multiplying spectrum $S(k-T+i)$ which is close to and apart by from spectrum $S(k-T)$ by predetermined filter coefficient $\beta_i$ is actually added up for all i's and the resulting spectrum is substituted into $S2_p'(k)$. This processing is expressed by equation 15 below.

(Equation 15)

$$S2_p'(k) = \sum_{i=-1}^{1} \beta_i \cdot S2(k-T+i)^2 \quad [15]$$

By performing the above-mentioned calculation sequentially from $k=BS_p$ having a low frequency while changing k within a range of $BS_p \leq k < BS_p + BW_p$, estimated spectrum $S2_p'(k)$ in $BS_p \leq k < BS_p + BW_p$ is calculated.

The above-described filtering processing is performed by clearing S(k) to 0 every time pitch coefficient T is given from pitch coefficient setting section 264 within a range of $BS_p \leq k < BS_p + BW_p$. That is, S(k) is calculated and outputted to searching section 263 every time pitch coefficient T is changed.

Figure 3:
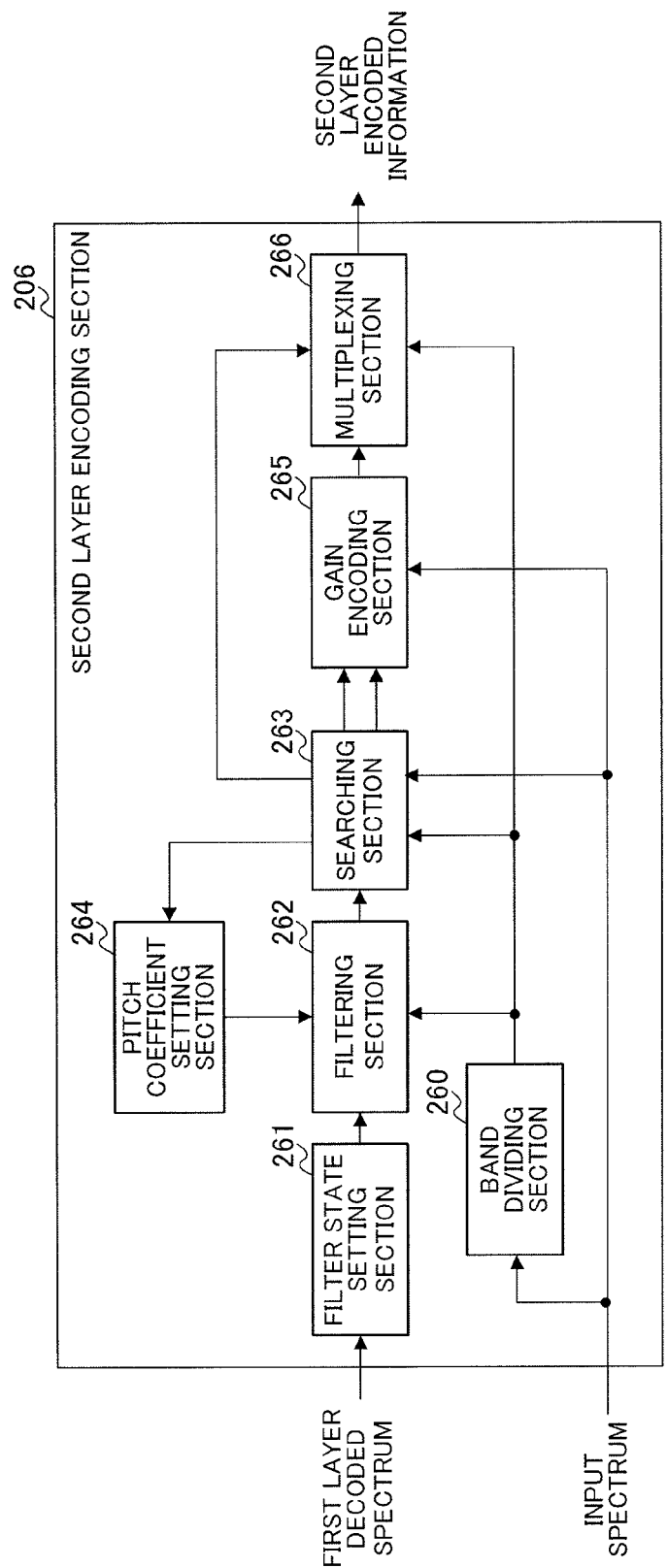
FIG. 3 is a block diagram showing a principal internal configuration of the second layer encoding section shown in FIG. 2 according to Embodiment 1 of the claimed invention.
Figure 7:
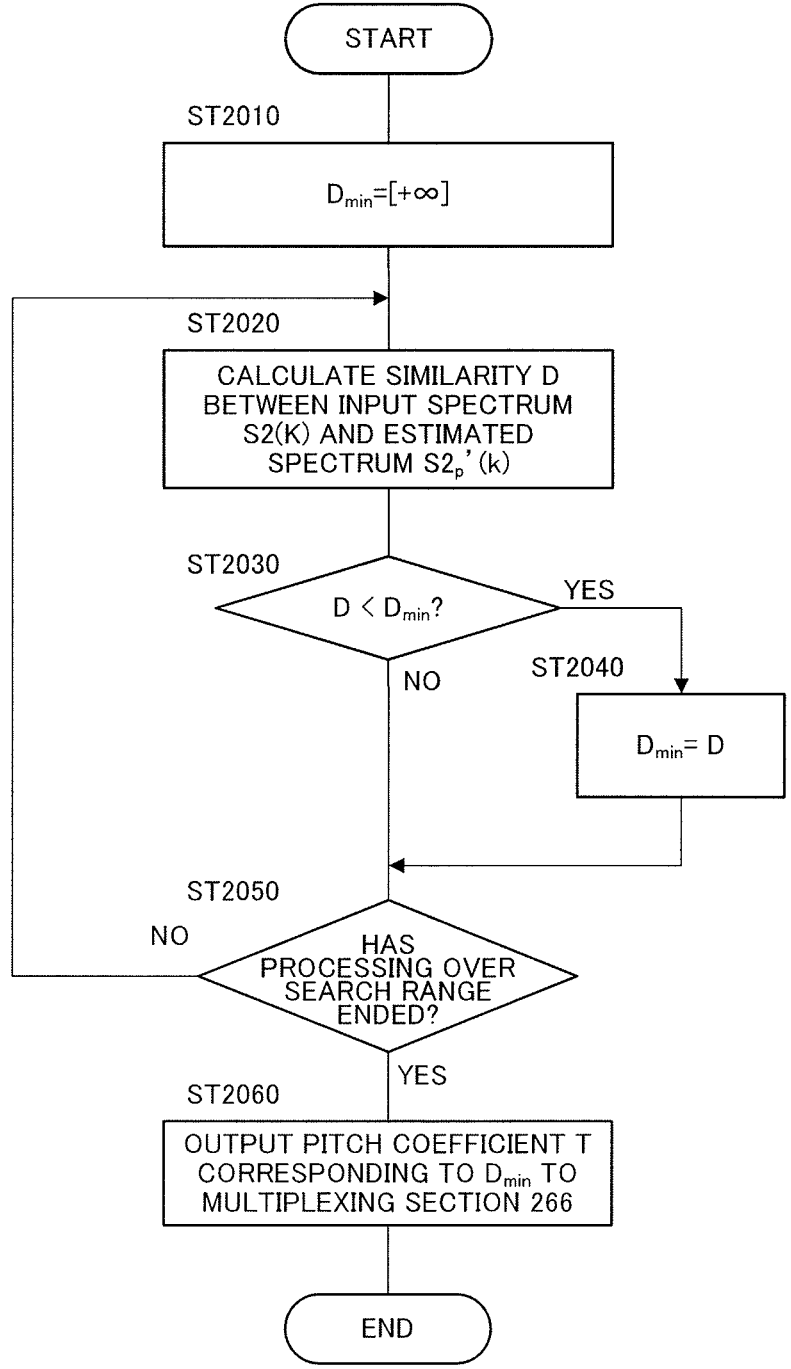
FIG. 7 is a flowchart showing a procedure for processing of searching optimum pitch coefficient $T_p'$ for subband $SB_p$ in the searching section according to Embodiment 1 of the claimed invention.

FIG. 7 is a flowchart showing a procedure for the processing of searching optimum pitch coefficient $T_p'$ for subband $SB_p$ in searching section 263 shown in FIG. 3. Searching section 263 searches optimum pitch coefficient $T_p'$ (p=0, 1, ..., P-1) corresponding to each subband $SB_p$ (p=0, 1, ..., P-1) by repeating the procedure shown in FIG. 7.

First, searching section 263 initializes, to "+∞," minimum similarity $D_{min}$ which is a variable to save a minimum value of similarity (ST2010). Next, searching section 263 calculates similarity D between the high-frequency portion (FL≤k<FH) of input spectrum $S2(k)$ for a predetermined pitch coefficient and estimated spectrum $S2_p'(k)$ according to equation 16 below (ST2020).

(Equation 16)

$$D = \sum_{k=0}^{M'} S2(BS_p+k) \cdot S2(BS_p+k) - \frac{\left( \sum_{k=0}^{M'} S2(BS_p+k) \cdot S2'(BS_p+k) \right)^2}{\sum_{k=0}^{M'} S2'(BS_p+k) \cdot S2'(BS_p+k)} \quad (0 < M' \leq BW_p) \quad [16]$$

In equation 16, M' denotes the number of samples when calculating similarity D and may be an optional value no greater than the bandwidth of each subband. $S2_p'(k)$ does not exist in equation 16. This is because $S2_p'(k)$ is expressed using $BS_p$ and $S2'(k)$.

Next, searching section 263 determines whether or not calculated similarity D is smaller than minimum similarity $D_{min}$ (ST2030). When the similarity calculated in ST2020 is smaller than minimum similarity $D_{min}$ (ST2030: "YES"), searching section 263 substitutes similarity D into minimum similarity $D_{min}$ (ST2040). On the other hand, when the similarity calculated in ST2020 is no less than minimum similarity $D_{min}$ (ST2030: "NO"), searching section 263 determines whether or not the processing over the search range has ended. That is, searching section 263 determines whether or not similarity is calculated for all pitch coefficients within the search range according to equation 16 above in ST2020 (ST2050). In a case where the processing has not ended over the search range (ST2050: "NO"), searching section 263 returns the processing to ST2020 again. Searching section 263 then calculates similarity according to equation 16 for a pitch coefficient different from when similarity is calculated according to equation 16 in the procedure in previous ST2020. On the other hand, in a case where the processing over the search range has ended (ST2050: "YES"), searching section 263 outputs pitch coefficient T corresponding to minimum similarity $D_{min}$ to multiplexing section 266 as optimum pitch coefficient $T_p'$ (ST2060).

Next, decoding apparatus 103 shown in FIG. 1 will be described.

Figure 8:
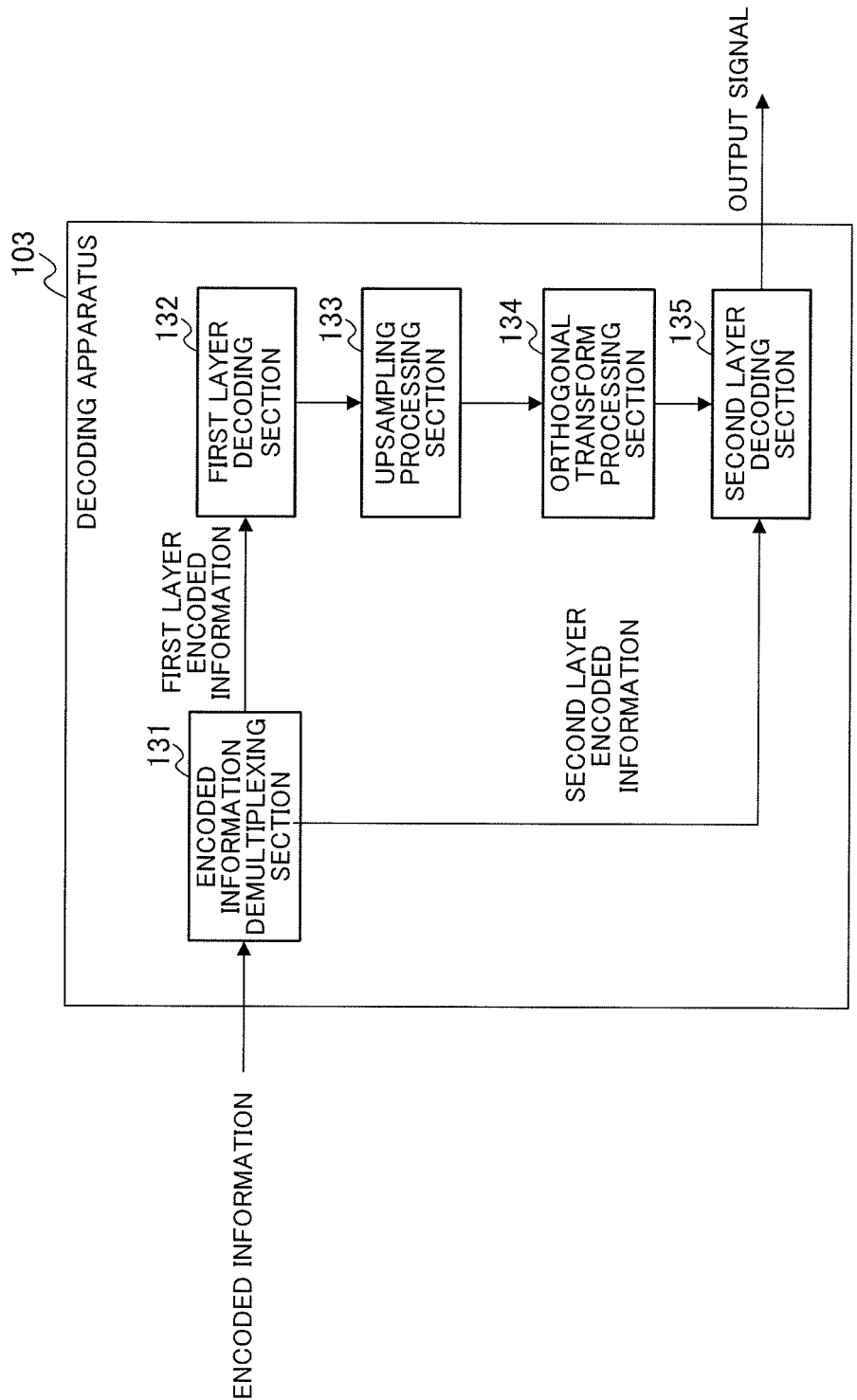
FIG. 8 is a block diagram showing a principal internal configuration of the decoding apparatus shown in FIG. 1 according to Embodiment 1 of the claimed invention.

FIG. 8 is a block diagram showing a principal internal configuration of decoding apparatus 103.

In FIG. 8, encoded information demultiplexing section 131 demultiplexes inputted encoded information (i.e., encoded information received from encoding apparatus 101) into first layer encoded information and second layer encoded information, outputs the first layer encoded information to first layer decoding section 132 and outputs the second layer encoded information to second layer decoding section 135.

First layer decoding section 132 decodes the first layer encoded information inputted from encoded information demultiplexing section 131 and outputs the generated first layer decoded signal to upsampling processing section 133. Since the operation of first layer decoding section 132 is similar to that of first layer decoding section 203 shown in FIG. 2, detailed descriptions thereof will be omitted.

Upsampling processing section 133 performs upsampling processing on the first layer decoded signal inputted from first layer decoding section 132 by upsampling the sampling frequency from $SR_2$ to $SR_1$ and outputs the upsampled first layer decoded signal obtained to orthogonal transform processing section 134.

Orthogonal transform processing section 134 applies orthogonal transform processing (i.e., MDCT) to the upsampled first layer decoded signal inputted from upsampling processing section 133 and outputs MDCT coefficient (hereinafter referred to as "first layer decoded spectrum") $S1(k)$ of the upsampled first layer decoded signal obtained to second layer decoding section 135. Since the operation of orthogonal transform processing section 134 is similar to that of the processing on the upsampled first layer decoded signal of orthogonal transform processing section 205 shown in FIG. 2, detailed descriptions thereof will be omitted.

Second layer decoding section 135 estimates a high-frequency portion of a speech signal from first layer decoded spectrum $S1(k)$ using the first layer decoded spectrum $S1(k)$ inputted from orthogonal transform processing section 134 and the second layer encoded information inputted from encoded information demultiplexing section 131, adjusts the amplitude of the spectral component to thereby generate a second layer decoded signal including the high-frequency component and outputs the second layer decoded signal as an output signal.

Figure 9:
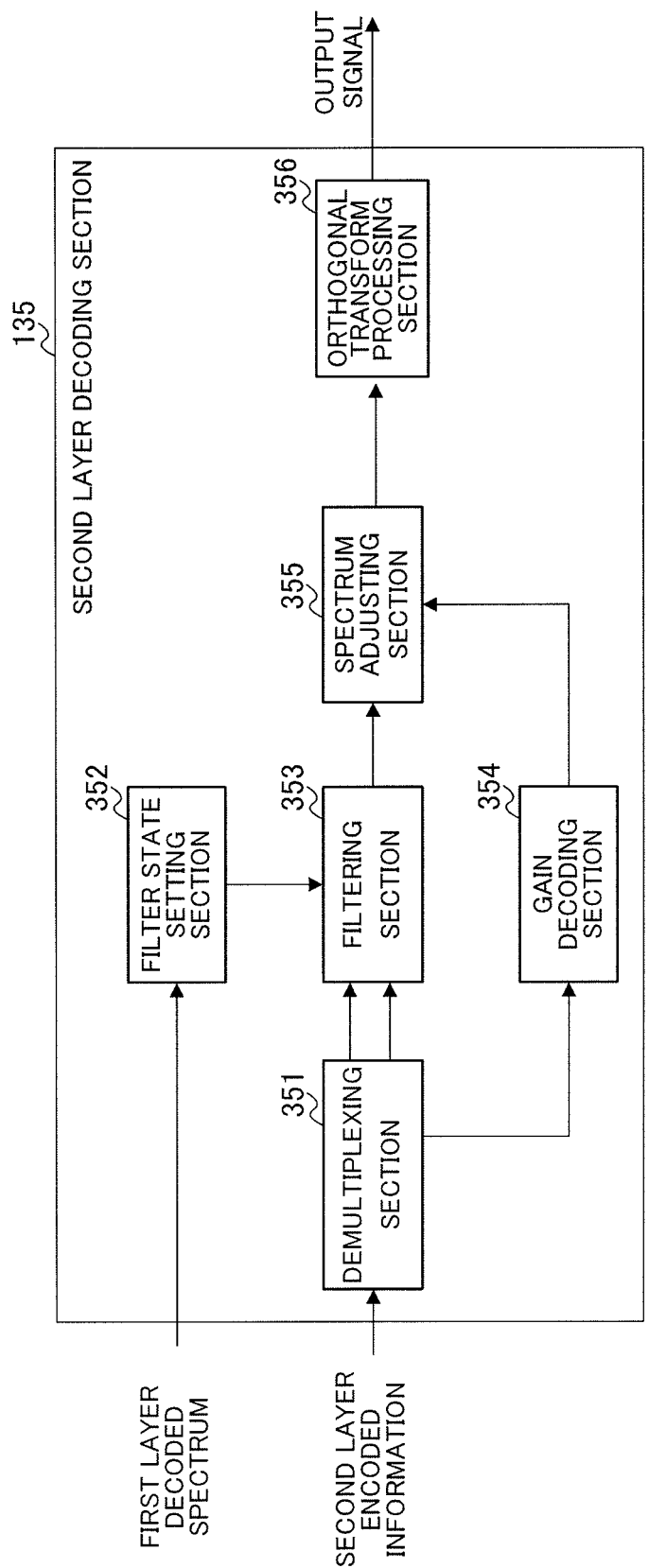
FIG. 9 is a block diagram showing a principal internal configuration of the second layer decoding section shown in FIG. 8 according to Embodiment 1 of the claimed invention.

FIG. 9 is a block diagram showing a principal internal configuration of second layer decoding section 135 shown in FIG. 8.

Demultiplexing section 351 demultiplexer the second layer encoded information inputted from encoded information demultiplexing section 131 into band division information containing bandwidth $BW_p$ (p=0, 1, ..., P–1) of each subband and start index $BS_p$ (p=0, 1, ..., P–1) (FL≤$BS_p$<FH), optimum pitch coefficient $T_p'$ (p=0, 1, ..., P–1) which is information on filtering, and ideal gain encoded information (j=0, 1, ..., J–1) and indices of logarithmic gain encoded information (3=0, 1, ..., J–1) which are information on the gain. Demultiplexing section 351 outputs the band division information and optimum pitch coefficient $T_p'$ (p=0, 1, ..., P–1) to filtering section 353 and outputs the ideal gain encoded information and the indices of the logarithmic gain encoded information to gain decoding section 354. If encoded information demultiplexing section 131 has already demultiplexed the band division information, optimum pitch coefficient $T_p'$ (p=0, 1, ..., P–1), the ideal gain encoded information and the indices of the logarithmic gain encoded information, demultiplexing section 351 need not be provided.

Filter state setting section 352 sets first layer decoded spectrum $S1(k)$ (0≤k<FL) inputted from orthogonal transform processing section 134 as a filter state used in filtering section 353. When the spectrum of full frequency band 0≤k<FH in filtering section 353 is called "S(k)" for convenience, first layer decoded spectrum $S1(k)$ is stored in a band of 0≤k<FL of S(k) as an internal state of the filter (i.e., filter state). Since the configuration and operation of filter state setting section 352 are similar to those of filter state setting section 261 shown in FIG. 3, detailed descriptions thereof will be omitted.

Filtering section 353 is provided with a multi-tap (the number of taps is greater than 1) pitch filter. Filtering section 353 filters first layer decoded spectrum $S1(k)$ based on the band division information inputted from demultiplexing section 351, the filter state set by filter state setting section 352, pitch coefficient $T_p'$ (p=0, 1, ..., P–1) inputted from demultiplexing section 351 and a filter coefficient internally stored beforehand, and calculates estimate value $S2_p'(k)$ ($BS_p$≤k<$BS_p$+$BW_p$) (p=0, 1, ..., P–1) of each subband $SB_p$ (p=0, 1, ..., P–1) shown in equation 15 above. Filtering section 353 also uses the filter function shown in equation 14 above. However, an assumption is made that T in equation 14 and equation 15 is substituted by $T_p'$ for the filtering processing and filter function in this case. That is, filtering section 353 estimates the high-frequency portion of the input spectrum in encoding apparatus 101 from the first layer decoded spectrum.

Gain decoding section 354 decodes the ideal gain encoded information and indices of logarithmic gain encoded information inputted from demultiplexing section 351 and calculates quantized ideal gain $\alpha 1Q_p$ and quantized logarithmic gain $\alpha 2Q_p$ which are quantized values of ideal gain $\alpha 1_p$ and logarithmic gain $\alpha 2_p$.

Spectrum adjusting section 355 calculates a decoded spectrum from estimate value $S2_p'(k)$ ($BS_p$≤k<$BS_p$+$BW_p$) (p=0, 1, ..., P–1) of each subband $SB_p$ (p=0, 1, ..., P–1) inputted from filtering section 353 and ideal gain $\alpha 1Q_p$ per subband inputted from gain decoding section 354 and outputs the calculated decoded spectrum to orthogonal transform processing section 356.

Figure 10:
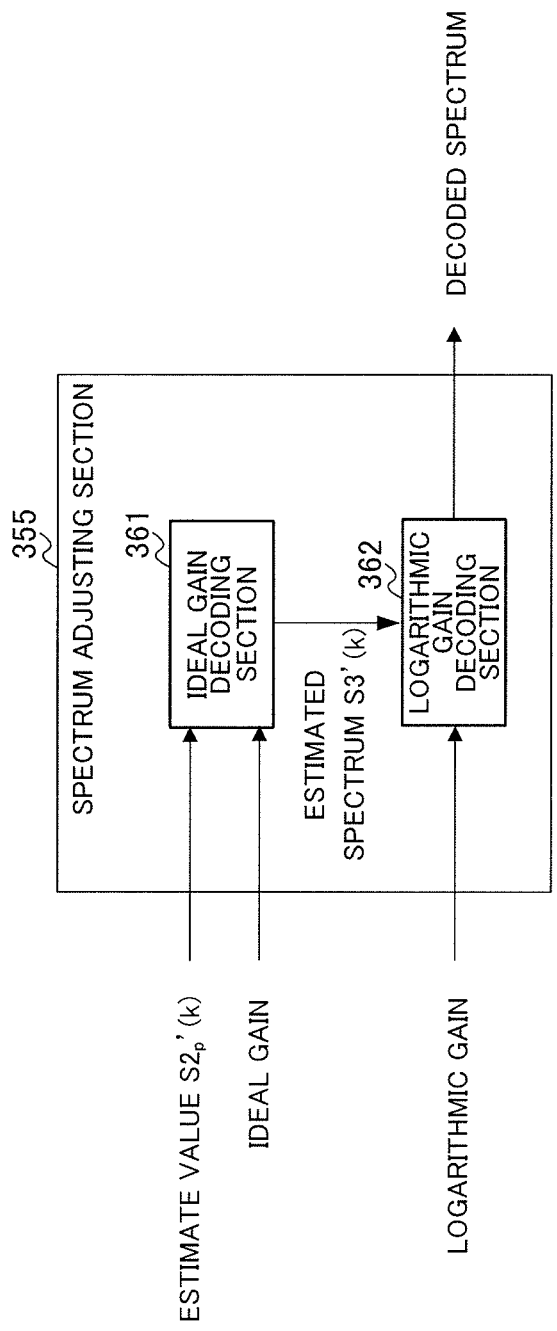
FIG. 10 is a block diagram showing a principal internal configuration of the spectrum adjusting section shown in FIG. 9 according to Embodiment 1 of the claimed invention.

FIG. 10 is a diagram showing an internal configuration of spectrum adjusting section 355. Spectrum adjusting section 355 is mainly constructed of ideal gain decoding section 361 and logarithmic gain decoding section 362.

Ideal gain decoding section 361 makes estimate value $S2_p'(k)$ ($BS_p$≤k<$BS_p$+$BW_p$) (p=0, 1, ..., P–1) of each subband inputted from filtering section 353 continuous in a frequency domain to obtain estimated spectrum $S2'(k)$ for the input spectrum. Next, ideal gain decoding section 361 multiplies estimated spectrum $S2'(k)$ by quantized ideal gain $\alpha 1Q_p$ per subband inputted from gain decoding section 354 according to equation 17 to calculate estimated spectrum $S3'(k)$. Ideal gain decoding section 361 outputs estimated spectrum $S3'(k)$ to logarithmic gain decoding section 362.

$$S3'(k)=S2'(k) \cdot \alpha 1Q_p \; (BL_p \leq k \leq BH_p, \text{ for all } p) \quad \text{(Equation 17)}$$

Logarithmic gain decoding section 362 adjusts energy in the logarithmic region for estimated spectrum S3'(k) inputted from ideal gain decoding section 361 using quantized logarithmic gain $\alpha 2Q_p$ per subband inputted from gain decoding section 354 and outputs the spectrum obtained to orthogonal transform processing section 356 as a decoded spectrum.

Figure 11:
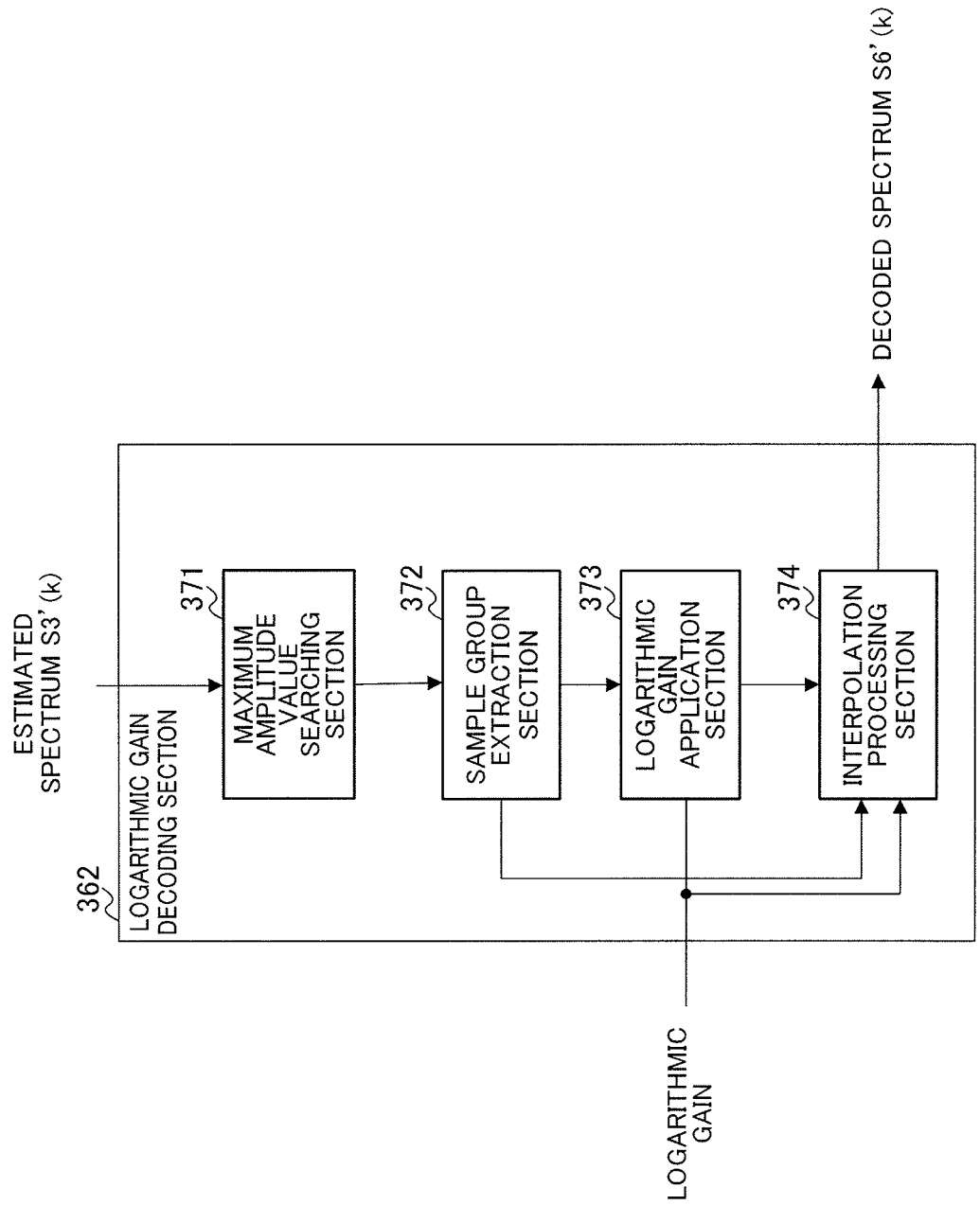
FIG. 11 is a block diagram showing a principal internal configuration of the logarithmic gain decoding section shown in FIG. 10 according to Embodiment 1 of the claimed invention.

FIG. 11 is a diagram showing an internal configuration of logarithmic gain decoding section 362. Logarithmic gain decoding section 362 is mainly constructed of maximum amplitude value searching section 371, sample group extraction section 372, logarithmic gain application section 373, and interpolation processing section 374.

According to equation 18, maximum amplitude value searching section 371 searches for maximum amplitude value MaxValue$_p$ in the logarithmic region, an index of a sample (spectral component) with the maximum amplitude and maximum amplitude index MaxIndex$_p$ per subband with respect to estimated spectrum S3'(k) inputted from ideal gain decoding section 361. Maximum amplitude value searching section 371 then outputs estimated spectrum S3'(k), maximum amplitude value MaxValue$_p$ in the logarithmic region and maximum amplitude index MaxIndex$_p$ to sample group extraction section 372.

(Equation 18)

$$\begin{cases} MaxValue_p = \max(\log_{10}|S3'(k)|) \\ MaxIndex_p = k \text{ where } MaxValue_p = \log_{10}|S3'(k)| \end{cases} \quad [18]$$

$(BL_p \leq k \leq BH_p, \text{ for all } p)$

As shown in equation 19, sample group extraction section 372 determines extraction flag SelectFlag(k) for each sample in accordance with calculated maximum amplitude index MaxIndex$_p$ for each subband. That is, sample group extraction section 372 selects a part of samples according to weight values with which samples (spectral components) closer to the sample having maximum amplitude value MaxValue$_p$ in each subband are more easily selected. Sample group extraction section 372 then outputs estimated spectrum S3'(k), maximum amplitude value MaxValue$_p$ per subband and extraction flag SelectFlag(k) to logarithmic gain application section 373. Furthermore, sample group extraction section 372 outputs extraction flag SelectFlag(k) to interpolation processing section 374.

(Equation 19)

$$SelectFlag(k) = \begin{cases} 0 & (k < MaxIndex_p - Near_p, MaxIndex_p + Near_p < k) \\ 1 & \begin{pmatrix} MaxIndex_p - Near_p \leq k \leq MaxIndex_p + Near_p \\ \text{or} \\ k = 0, 2, 4, 6, 8, \ldots \text{ (even)} \end{pmatrix} \end{cases} \quad [19]$$

$(BL_p \leq k \leq BH_p, \text{ for all } p)$

Logarithmic gain application section 373 calculates Sign$_p$(k) indicating a sign (+, −) of the extracted sample group from estimated spectrum S3'(k) inputted from sample group extraction section 372 and extraction flag SelectFlag(k) according to equation 20. That is, as shown in equation 20, logarithmic gain application section 373 sets Sign$_p$(k)=1 when the sign of the extracted sample is '+' (when S3'(k)≥0) and sets Sign$_p$(k)=−1 otherwise (when the sign of the extracted sample is '−').

(Equation 20)

$$Sign_p(k) = \begin{cases} 1 & (\text{if } S3'(k) \geq 0) \\ -1 & (\text{else}) \end{cases} \quad [20]$$

$(BL_p \leq k \leq BH_p, \text{ for all } p)$

Logarithmic gain application section 373 calculates estimated spectrum S5'(k) according to equation 21 and equation 22 for a sample having an extraction flag SelectFlag(k) value of 1 based on estimated spectrum S3'(k) inputted from sample group extraction section 372, maximum amplitude value MaxValue$_p$ and extraction flag SelectFlag(k), quantized logarithmic gain $\alpha 2Q_p$ inputted from gain decoding section 354 and code Sign$_p$(k) calculated according to equation 20.

(Equation 21)

$$S4'(k) = \alpha 2Q_p \cdot (\log_{10}(S3'(k)) - MaxValue_p) + MaxValue_p \quad [21]$$

$$\begin{pmatrix} BL_p \leq k \leq BH_p, \text{ for all } p \\ \text{if } SelectFlag(k) = 1 \end{pmatrix}$$

(Equation 22)

$$S5'(k) = 10^{S4'(k)} \cdot Sign_p(k) \quad [22]$$

$(BL_p \leq k \leq BH_p, \text{ for all } p)$

That is, logarithmic gain application section 373 applies logarithmic gain $\alpha 2_p$ to only the part of samples (i.e., a sample having extraction flag SelectFlag(k)=1) selected by sample group extraction section 372. Logarithmic gain application section 373 then outputs estimated spectrum S5'(k) to interpolation processing section 374.

Extraction flag SelectFlag(k) is inputted to interpolation processing section 374 from sample group extraction section 372. Moreover, estimated spectrum S5'(k) is inputted to interpolation processing section 374 from logarithmic gain application section 373. Furthermore, logarithmic gain $\alpha 2_p$ is inputted to interpolation processing section 374 from gain decoding section 354. Interpolation processing section 374 calculates linear interpolation parameter $\alpha 3_p$ in a linear region in accordance with logarithmic gain $\alpha 2_p$ according to equation 23 first.

(Equation 23)

$$\alpha 3_p = \begin{cases} ALPHA3\_LOW & (\text{if } \alpha 2_p < TH) \\ ALPHA\_HIGH & (\text{else}) \end{cases} \quad [23]$$

$(p = 0, \ldots, P - 1)$

As shown in equation 23, linear interpolation parameter $\alpha 3_p$ is adaptively set from among values (ALPHA3_LOW and ALPHA3_HIGH in this case) predetermined in accordance with the value of logarithmic gain $\alpha 2_p$. In equation 23, TH is a predetermined threshold.

Next, interpolation processing section 374 performs linear interpolation in the linear region on a sample group having an extraction flag SelectFlag(k) value of 0 according to equation 24 to calculate decoded spectrum S6'(k). That is, interpolation processing section 374 applies linear interpolation parameter $\alpha 3_p$ which is adaptively set in accordance with the value of logarithmic gain $\alpha 2_p$ to the sample (sample (spectral component) of extraction flag SelectFlag(k)=0, which has not been selected as the part of the samples by sample group extraction section 372.

(Equation 24)

$$S6'(k) = \{\alpha 3_p \cdot S5'(k) + (1 - \alpha 3_p) \cdot 10^{MaxValue_p}\} \cdot \text{Sign}_p(k) \quad [24]$$

$$\begin{pmatrix} BL_p \le k \le BH_p, \text{ for all } p \\ \text{if } SelectFlag(k) = 0 \end{pmatrix}$$

Specific examples of linear interpolation parameter $\alpha 3_p$ include TH=0.45, ALPHA3_LOW=0.75, ALPHA3_HIGH=0.95 in equation 23. That is, interpolation processing section 374 sets small linear interpolation parameter $\alpha 3_p$ when the value of logarithmic gain $\alpha 2_p$ is smaller than preset threshold TH and sets great linear interpolation parameter $\alpha 3_p$ when the value of logarithmic gain $\alpha 2_p$ is no less than preset threshold TH. Experiments have confirmed that the claimed invention is particularly effective under this condition.

Linear interpolation processing in the linear region using maximum amplitude value $MaxValue_p$ in the logarithmic region calculated in maximum amplitude value searching section 371 is used in equation 24, but a maximum amplitude value in the linear region may also be used instead of a maximum amplitude value in the logarithmic region. In this case, maximum amplitude value searching section 371 calculates maximum amplitude value $MaxValue_p$ in the linear region as shown in equation 25 instead of equation 18. Furthermore, in this case, interpolation processing section 374 performs linear interpolation processing in the linear region according to equation 26 instead of equation 24. This configuration can reduce the number of times logarithmic conversion processing and exponent conversion processing as shown in equation 18 and equation 24 are executed, and further reduce the amount of calculation.

(Equation 25)

$$\begin{cases} MaxValue_p = \max(|S3'(k)|) \\ MaxIndex_p = k \text{ where } MaxValue_p = |S3'(k)| \end{cases} \quad [25]$$

$(BL_p \le k \le BH_p, \text{ for all } p)$ (Equation 26)

$$S6'(k) = \{\alpha 3_p \cdot S5'(k) + (1 - \alpha 3_p) \cdot MaxValue_p\} \cdot \text{Sign}_p(k) \quad [26]$$

$$\begin{pmatrix} BL_p \le k \le BH_p, \text{ for all } p \\ \text{if } SelectFlag(k) = 0 \end{pmatrix}$$

Next, interpolation processing section 374 outputs calculated decoded spectrum S6'(k) to orthogonal transform processing section 356. The low-frequency portion (0≤k<FL) of decoded spectrum S6'(k) is formed of first layer decoded spectrum S1(k). Furthermore, the high-frequency portion (FL≤k<FH) of decoded spectrum S6'(k) is formed of a spectrum for which energy adjustment in the logarithmic region (i.e., processing in logarithmic gain application section 373) and energy adjustment in the linear region (i.e., linear interpolation processing in interpolation processing section 374) have been performed on estimated spectrum S3'(k).

Effects of the linear interpolation processing in the linear region (i.e., amplitude adjustment processing in the linear region) in interpolation processing section 374 will be described.

Energy adjustment processing in the logarithmic region disclosed in Patent Literature 1 is processing using the characteristics of human perception, which is a quite effective technique. However, the energy adjustment processing in the logarithmic region disclosed in Patent Literature 1 needs to perform logarithmic conversion targeting all samples (i.e., MDCT coefficients), which results in a problem that the amount of calculation processing increases considerably. In contrast, the claimed invention adopts a scheme of limiting the sample to be subjected to energy adjustment processing in the logarithmic region to only samples selected by sample group extraction section 372. In this scheme, linear interpolation processing in the linear region is performed on samples not selected. In this case, as shown in equation 23, the present scheme adaptively selects linear interpolation coefficient $\alpha 3_p$ in accordance with the value of logarithmic gain $\alpha 2_p$ used for energy adjustment processing in the logarithmic region and thereby similarly realizes the same processing as the energy adjustment processing using a logarithmic gain in the logarithmic region through linear interpolation processing in the linear region. The present scheme enables performing energy adjustment processing suitable for the characteristics of human perception with a much small amount of calculation processing compared to the conventional technique disclosed in Patent Literature 1.

Figure 12:
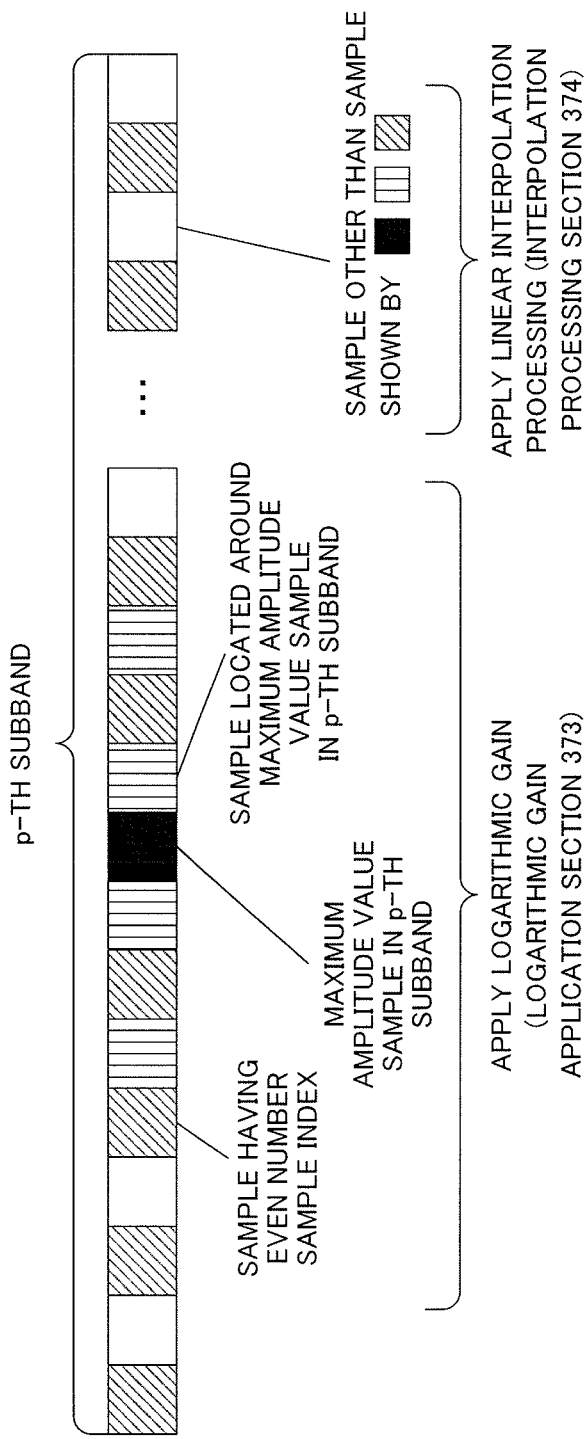
FIG. 12 is a diagram showing samples to which the logarithmic gain application section and the interpolation processing section in the logarithmic gain decoding section according to Embodiment 1 of the claimed invention are applied.

FIG. 12 shows an example of sample groups to be subjected to logarithmic gain application processing and linear interpolation processing in the linear region in logarithmic gain decoding section 362.

In FIG. 12, the black block represents a sample having a maximum amplitude value in each subband (i.e., a p-th subband in FIG. 12), the diagonally shaded block represents a sample having an even number sample index, the vertically shaded block represents a sample located around the sample having the maximum amplitude value (black block) and white blocks represent samples other than the above-described three types of block.

In the example shown in FIG. 12, logarithmic gain application section 373 applies a logarithmic gain to a sample group of samples other than samples shown by white blocks and interpolation processing section 374 applies interpolation processing in the linear region to a sample group shown by white blocks. FIG. 12 is merely an example, and thus the claimed invention is also applicable to a configuration other than that shown in the figure showing a number of samples around the sample having the maximum amplitude value.

Orthogonal transform processing section 356 applies orthogonal transform to decoded spectrum S6'(k) inputted from spectrum adjusting section 355 to transform it into a time-domain signal and outputs the second layer decoded signal obtained, as an output signal. Processing such as windowing and overlap addition is performed as appropriate to avoid discontinuity generated between frames.

Hereinafter, specific processing in orthogonal transform processing section 356 will be described.

Orthogonal transform processing section 356 includes buffer buf'(k) and initializes buffer buf'(k) as shown in equation 27 below.

[27]

$$\text{buf}'(k) = 0 \; (k = 0, \ldots, N-1) \qquad \text{(Equation 27)}$$

Furthermore, orthogonal transform processing section 356 obtains second layer decoded signal $y_n''$ using second layer decoded spectrum S6'(k) inputted from spectrum adjusting section 355 according to equation 28 below.

(Equation 28)

$$y''_n = \frac{2}{N} \sum_{n=0}^{2N-1} Z4(k) \cos\left[\frac{(2n+1+N)(2k+1)\pi}{4N}\right]$$ [28]

$(n = 0, \ldots, N-1)$

In equation 28, $Z4(k)$ is a vector that combines decoded spectrum $S6'(k)$ and buffer $buf'(k)$ as shown in equation 29 below.

(Equation 29)

$$Z4(k) = \begin{cases} buf'(k) & (k = 0, \ldots N-1) \\ S6'(k) & (k = N, \ldots 2N-1) \end{cases}$$ [29]

Next, orthogonal transform processing section 356 updates buffer $buf'(k)$ according to equation 30 below.

[30]

$buf(k) = S6'(k)$ $(k=0, \ldots, N-1)$ (Equation 30)

Orthogonal transform processing section 356 then outputs decoded signal $y_n''$ as an output signal.

Thus, according to the present embodiment, the encoding apparatus estimates a spectrum of the high-frequency portion using a low-frequency spectrum decoded in encoding/decoding of performing band expansion using a spectrum of the low-frequency portion and estimating a spectrum of the high-frequency portion. The encoding apparatus then selects (puncturing) a sample group for each subband of the estimated spectrum and calculates a gain adjusting parameter for performing gain adjustment in the logarithmic region on only the selected sample. Furthermore, the decoding apparatus (including the local decoding section on the encoding apparatus side) applies the gain adjusting parameter only to a sample group selected by focusing on samples around the sample having the maximum amplitude value in each subband of the estimated spectrum and applies interpolation processing in the linear region to other sample groups using a linear interpolation coefficient adaptively selected in accordance with the gain adjusting parameter. This configuration allows the encoding apparatus to considerably reduce the amount of calculation processing necessary to calculate a gain adjusting parameter necessary for gain adjustment in the logarithmic region. Furthermore, the decoding apparatus can considerably reduce the amount of calculation processing necessary for energy adjustment processing suitable for human perception.

Regarding the setting of an extraction flag, the present embodiment has described a configuration of searching a sample having a maximum amplitude value in a subband and then setting an extraction flag in accordance with the distance from the sample as an example. However, the claimed invention is not limited to the above described example, and is likewise applicable to a case where, for example, the decoding apparatus searches for a sample having a minimum amplitude value, sets an extraction flag of each sample in accordance with the distance from the sample having the minimum amplitude value, calculates and applies an amplitude adjusting parameter such as logarithmic gain for only the extracted sample (i.e., sample for which the value of an extraction flag is set to 1), and/or the like. Such a configuration can be said to be effective, for example, when the amplitude adjusting parameter has an effect of attenuating the estimated high-frequency spectrum. Although there may be a case where abnormal sound is produced by attenuating the high-frequency spectrum of a sample of large amplitude, applying attenuation processing to only samples around the sample having the minimum amplitude value may improve the sound quality. Furthermore, instead of searching for the minimum amplitude value in the above-described configuration, a configuration is possible in which a maximum amplitude value is searched for, and weight factors (used as criteria) are assigned so that samples located at greater distances from the sample having the maximum amplitude value are more easily extracted. The claimed invention is likewise applicable to such a configuration.

Furthermore, the present embodiment has described an example of configuration in which in the setting of an extraction flag in the decoding apparatus, a sample having a maximum amplitude value in a subband is searched for, and the extraction flag is then set in accordance with the distance from the sample. However, the claimed invention is not limited to the above described example, and thus the encoding apparatus is likewise applicable to a configuration in which a plurality of samples are selected in descending order of amplitude for each subband and extraction flags are set according to the distances from the respective samples. Adopting the above configuration makes it possible to efficiently extract samples when there are a plurality of samples that have similar amplitude are present within a subband.

Furthermore, a case has been described in the present embodiment where the decoding apparatus determines whether or not a sample in each subband is close to the sample having the maximum amplitude value based on a threshold (i.e., $Near_p$ shown in Equation (19)) and thereby selects a part of the samples. In the claimed invention, for example, the decoding apparatus may select samples within a wider range for a higher-frequency subband as samples close to the sample having the maximum amplitude value. That is, the claimed invention may increase the value of $Near_p$ shown in equation 19 for higher-frequency subbands among a plurality of subbands. The increase in the value of $Near_p$ makes it possible to select a part of samples in an unbiased way among subbands even when a setting is made such that the subband width increases for higher frequencies such as Bark scale during band division and to prevent the sound quality of the decoded signal from deteriorating. It has been confirmed through experiments that good results can be obtained by setting the value of $Near_p$ shown in equation 19 to a value approximately ranging from 5 to 21 when the number of samples (i.e., MDCT coefficients) per frame is about 640 (e.g., setting the value of $Near_p$ of the subband of the lowest frequency region to 5 and the value of $Near_p$ of the subband of the highest frequency region to 21).

Furthermore, as shown in the present embodiment, it has been confirmed through experiments that the sound quality does not deteriorate even when the encoding apparatus calculates gain adjusting parameters from only samples of even-numbered indices and the decoding apparatus applies the gain adjusting parameters to extracted samples in consideration of distances from the sample having the maximum amplitude value in the subband. That is, there is no problem even if the target sample set (i.e., sample group) in calculation of a gain adjusting parameter does not necessarily coincide with the target sample set (sample group) in application of the gain adjusting parameter. For example, as shown in the present embodiment, this example indicates that if the encoding apparatus and the decoding apparatus extract samples uniformly over the entire subband, it is possible to efficiently calculate gain adjusting parameters without extracting all samples. However, the claimed invention is not limited to this example, and is likewise applicable to a configuration in which the encoding apparatus as well as the decoding apparatus selects a target sample group for which a logarithmic gain is calculated using a sample group extraction method in accordance with the distance from the maximum amplitude value in each subband.

Furthermore, a case has been described in the present embodiment where encoding/decoding processing in the low-frequency component of an input signal and encoding/decoding processing in the high-frequency component are performed independently of each other, that encoding/decoding is performed in a two-stage hierarchical structure. However, the claimed invention is not limited to this case, and is likewise applicable to a case where encoding/decoding is performed in a hierarchical structure of three or more stages. When a hierarchical encoding section of three or more stages is taken into account, for the second layer decoding section for generating a local decoded signal of the second layer encoding section, the sample set (sample group) to which a gain adjusting parameter (i.e., logarithmic gain) is applied may be a sample set without considering the distance from the sample having a maximum amplitude value calculated in the encoding apparatus of the present embodiment or may be a sample set in consideration of the distance from the sample having a maximum amplitude value calculated in the decoding apparatus of the present embodiment.

Furthermore, in the setting of an extraction flag by the encoding apparatus and the decoding apparatus, the present embodiment always sets the value of the extraction flag to 1 when the sample index is an even number. However, the claimed invention is not limited to this case, and is likewise applicable to a case where the value of the extraction flag is set to 1 when the remainder of the index with respect to 3 is 0, for example. That is, the present embodiment has no particular restrictions on samples extracted other than samples in accordance with distances from the sample having the maximum amplitude value, and is likewise applicable to a variety of selection methods.

Furthermore, a case has been described in the present embodiment where the number of subbands J obtained by dividing the high-frequency portion of input spectrum $S2(k)$ in gain encoding section 265 (FIG. 3) is different from the number of subbands P obtained by dividing the high-frequency portion of input spectrum $S2(k)$ in searching section 263. However, the claimed invention is not limited to this example, and the number of subbands P obtained by dividing the high-frequency portion of input spectrum $S2(k)$ in gain encoding section 265 may be set to P.

Furthermore, the present embodiment has described the configuration in which the high-frequency portion of the input spectrum is estimated using the low-frequency component of the first layer decoded spectrum obtained from the first layer decoding section. However, the claimed invention is not limited to this, but is likewise applicable to a configuration in which the high-frequency portion of the input spectrum is estimated using the low-frequency component of the input spectrum instead of the first layer decoded spectrum. In this configuration, the encoding apparatus calculates encoded information (i.e., second layer encoded information) to generate the high-frequency component of the input spectrum from the low-frequency component of the input spectrum and the decoding apparatus applies the encoded information to the first layer decoded spectrum to generate a high-frequency component of the decoded spectrum.

Furthermore, the present embodiment has described the processing of reducing the amount of calculation and improving the sound quality in the configuration in which parameters for adjusting the energy ratio in the logarithmic region are calculated and applied based on the processing in Patent Literature 1 as an example. However, the claimed invention is not limited to this, and is likewise applicable to a configuration in which the energy ratio and/or the like is adjusted in a non-linear conversion region other than the logarithmic conversion. Furthermore, the claimed invention is applicable not only to the non-linear conversion region but also to a linear conversion region likewise.

Furthermore, the present embodiment has described as an example the processing of reducing the amount of calculation and improving the sound quality in the configuration in which parameters for adjusting the energy ratio in the logarithmic region are calculated and applied in band expansion processing based on the processing in Patent Literature 1. However, the claimed invention is not limited to this, and is likewise applicable to processing other than band expansion processing.

Furthermore, a case has been described in the present embodiment where the interpolation processing section performs linear interpolation processing always using the same scheme regardless of the type of input signal (e.g., speech signal and audio signal) or spectral characteristics. However, the claimed invention is not limited to this, and is likewise applicable to a case where the processing in the interpolation processing section is adaptively changed in accordance with the type of input signal and spectral characteristics. For example, when the input signal has high peak performance, that is, the spectrum of the input signal contains low noise, the linear interpolation parameter in the interpolation processing section may be fixed (e.g., to 0.95), whereas when the input signal has low peak performance, that is, the spectrum of the input signal contains high noise, the linear interpolation parameter in the interpolation processing section may be changed to one of the two types as described in the above embodiment. When the input signal has high peak performance, the above described configuration can reduce the effect of energy adjustment processing in the interpolation processing section (i.e., preventing the amplitude of the sample from considerably changing before and after the interpolation processing), thereby allowing the suppression of abnormal sound when compared to the scheme described in the present embodiment. This is processing based on the perceptual characteristic that a perceptual masking value decreases with respect to a steep spectrum, meaning that amplification of the amplitude of a sample as a target of the linear interpolation processing is suppressed in a peak portion of the spectrum. However, the above-described configuration requires a processing section that determines characteristics of an input signal (e.g., intensity of peak performance) to be newly added compared to the scheme described in the present embodiment, resulting in an increase in the amount of calculation processing. Furthermore, in addition to the above-described selecting method, adaptively switch between a combination of a linear interpolation parameter and a threshold described in the present embodiment (i.e., TH, ALPHA3_LOW, ALPHA3_HIGH) and a combination different from the above combination (e.g., TH2, ALPHA3_LOW2, ALPHA3_HIGH2) may be possible in accordance with the type of input signal (e.g., speech signal and audio signal) and spectral characteristics.

Figure 13:
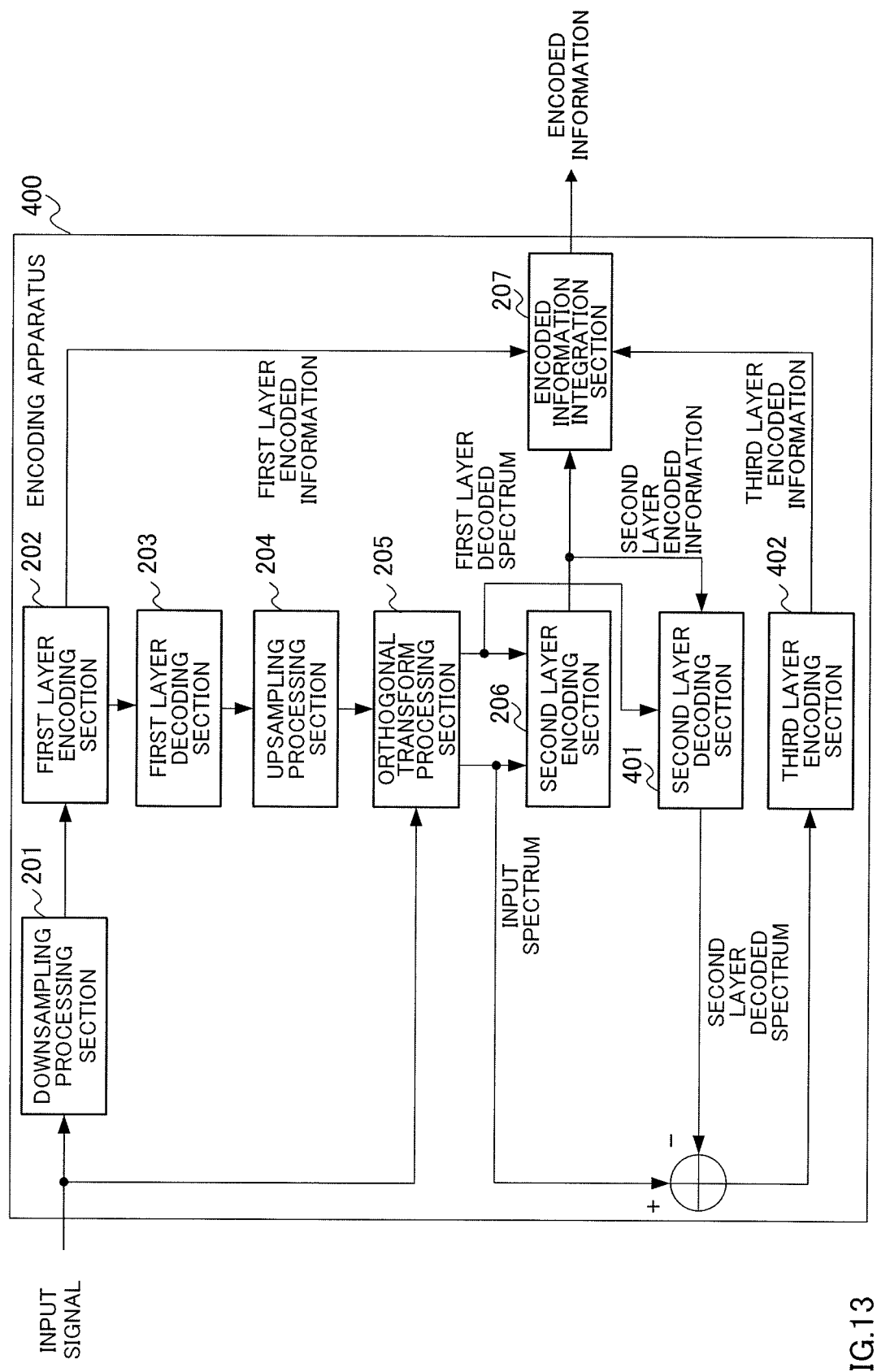
FIG. 13 is a block diagram showing the rest of the principal internal configuration of the encoding apparatus according to Embodiment 1 of the claimed invention.

Furthermore, the present embodiment has described the decoding processing method in the decoding apparatus. However, the claimed invention is not limited to a decoding apparatus, and is likewise applicable to an encoding apparatus including the above-described decoding processing method. For example, in addition to the configuration of encoding apparatus 101 shown in FIG. 2, the claimed invention is likewise applicable to encoding apparatus 400 further including second layer decoding section 401 that generates a second layer decoded spectrum using second encoded information and further including third layer encoding section 402 that encodes a residual component between a second layer decoded spectrum and a spectrum of an input signal (i.e., input spectrum) as shown in FIG. 13. Here, second layer decoding section 401 is a decoding processing section corresponding to second layer decoding section 135 shown in FIG. 9. However, second layer decoding section 401 is different from second layer decoding section 135 in that second layer decoding section 401 is not internally provided with orthogonal transform processing section 356 and outputs a frequency-domain signal (i.e., spectrum) instead of a time-domain signal. Furthermore, the name of the component outputted is also different. In other aspects, second layer decoding section 401 performs the processing similar to that performed by second layer decoding section 135. Furthermore, the claimed invention is not limited to the encoding method of third layer encoding section 402 and third layer encoding section 402 and can adopt a variety of quantization methods such as vector-quantizing a residual component. Although the number of encoding sections in encoding apparatus 400 shown in FIG. 13 is three, the claimed invention is likewise applicable to a case where the number of encoding sections is four or more.

Embodiment 2

Embodiment 1 has described the encoding apparatus and the corresponding decoding apparatus using a band expansion encoding scheme for generating a high-frequency spectrum from a low-frequency spectrum using an additional parameter (i.e., second layer encoded information in Embodiment 1).

G.722-SWB (G.722 Annex B) standardized in ITU-T can be cited an example of the scheme adopting a similar "band expansion encoding scheme." In G.722-SWB, the input signal is encoded according to a four-mode encoding/decoding scheme in accordance with characteristics of an input signal (e.g., input spectrum). Here, the four modes are TRANSIENT, NORMAL, HARMONIC and NOISE, and an appropriate mode is determined from the input spectrum.

The present embodiment will describe a configuration in which the band expansion encoding or decoding scheme described in Embodiment 1 (i.e., corresponding to the second layer encoding section or second layer decoding section in Embodiment 1) is applied in a multimode encoding or decoding scheme such as G.722-SWB in which an encoding or decoding scheme is changed in accordance with characteristics of an input signal. Furthermore, the present embodiment will describe a method for suppressing sound quality degradation (abnormal sound) that can occur when the encoding or decoding mode is changed in such a configuration.

G.722-SWB is a multimode encoding or decoding scheme having a four-mode encoding or decoding scheme, and for simplicity of description, a multimode encoding/decoding scheme having a two-mode encoding or decoding scheme will be described below as an example.

The configuration of a communication system having the encoding apparatus and the decoding apparatus according to the present embodiment is similar to the configuration in Embodiment 1 (FIG. 1). However, since the encoding apparatus and the decoding apparatus have different internal configurations, only reference numerals will be substituted, e.g., encoding apparatus 111 and decoding apparatus 113. Since the processing of encoding apparatus 111 and decoding apparatus 113 is identical to that of encoding apparatus 101 and decoding apparatus 103, descriptions thereof will be omitted herein.

Figure 14:
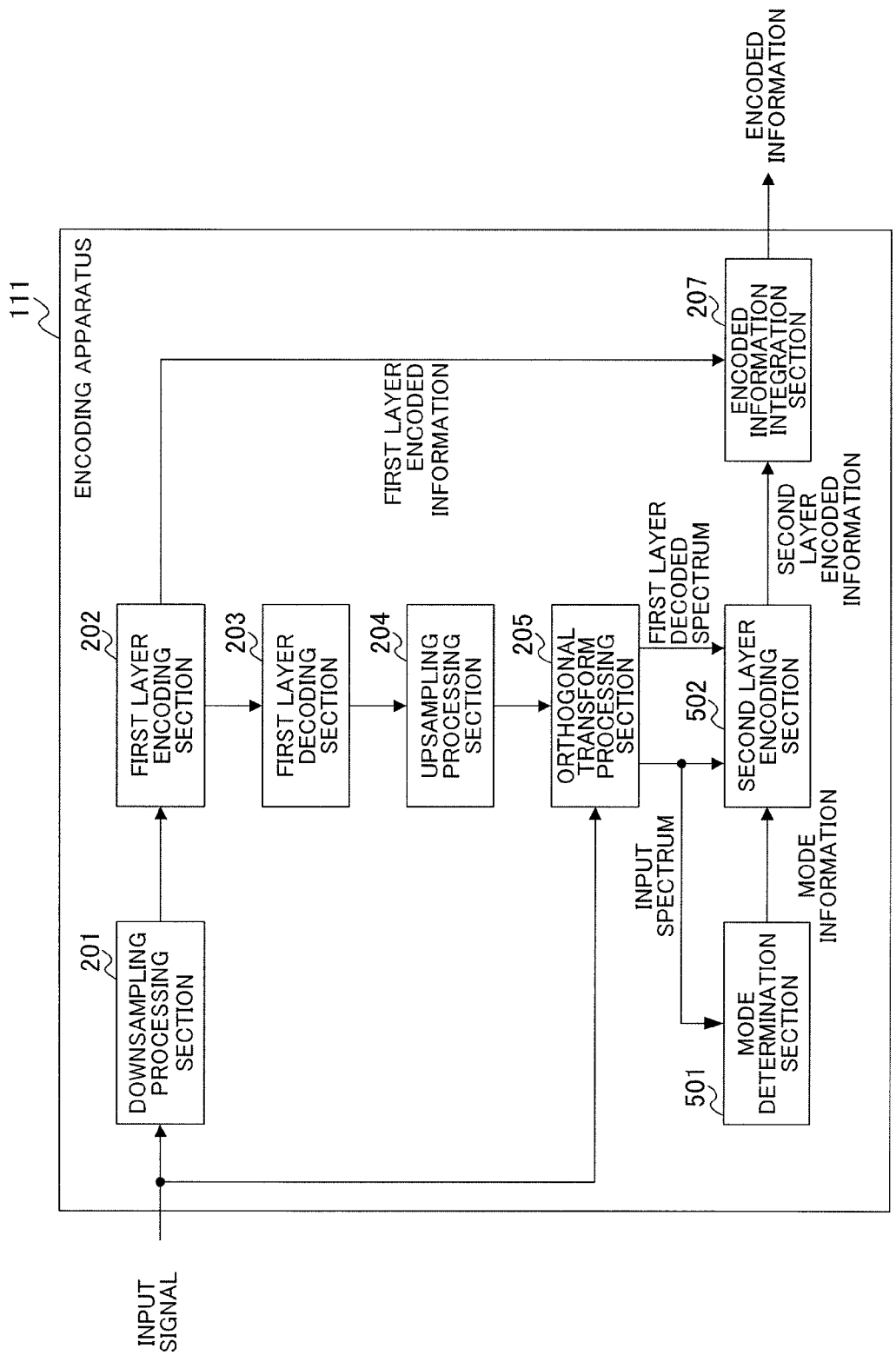
FIG. 14 is a block diagram showing a principal internal configuration of the encoding apparatus shown in FIG. 1 according to Embodiment 2 of the claimed invention.

FIG. 14 is a block diagram showing a principal internal configuration of encoding apparatus 111. In encoding apparatus 111 shown in FIG. 14, since components other than mode determination section 501 and second layer encoding section 502 are identical to the components in encoding apparatus 101 (FIG. 2) of Embodiment 1, those components will be assigned the same reference numerals and descriptions thereof will be omitted, hereinafter.

Mode determination section 501 receives an input spectrum from orthogonal transform processing section 205 as input. Mode determination section 501 analyzes spectral characteristics of the input spectrum inputted (that is, characteristics of the input signal) and determines mode information based on the analysis result. Mode determination section 501 outputs the determined mode information to second layer encoding section 502. The mode information is information indicating which one of two types of encoding schemes to be described hereinafter is used in encoding. More specifically, mode determination section 501 determines one of "mode 1" and "mode 2" as the mode information. For example, a method for mode determination section 501 to analyze whether the input spectrum is TRANSIENT or NON-TRANSIENT and determine the mode information based on the analysis result can be taken as an example. The details of the method of determining mode information (see G.722-SWB standard, for example) bear no immediate relationship with the claimed invention, and therefore description thereof will be omitted, hereinafter.

Second layer encoding section 502 receives the input spectrum and a first layer decoded spectrum from orthogonal transform processing section 205 as input. Furthermore, second layer encoding section 502 receives mode information from mode determination section 501 as input. Second layer encoding section 502 performs encoding on the input spectrum using one of two types of encoding schemes (mode 1 and mode 2) based on the inputted mode information using the first layer decoded spectrum and generates second layer encoded information. Second layer encoding section 502 outputs the generated second layer encoded information to transmission path 102 (FIG. 1) via encoded information integration section 207. The details of the processing of second layer encoding section 502 will be described, hereinafter.

Figure 15:
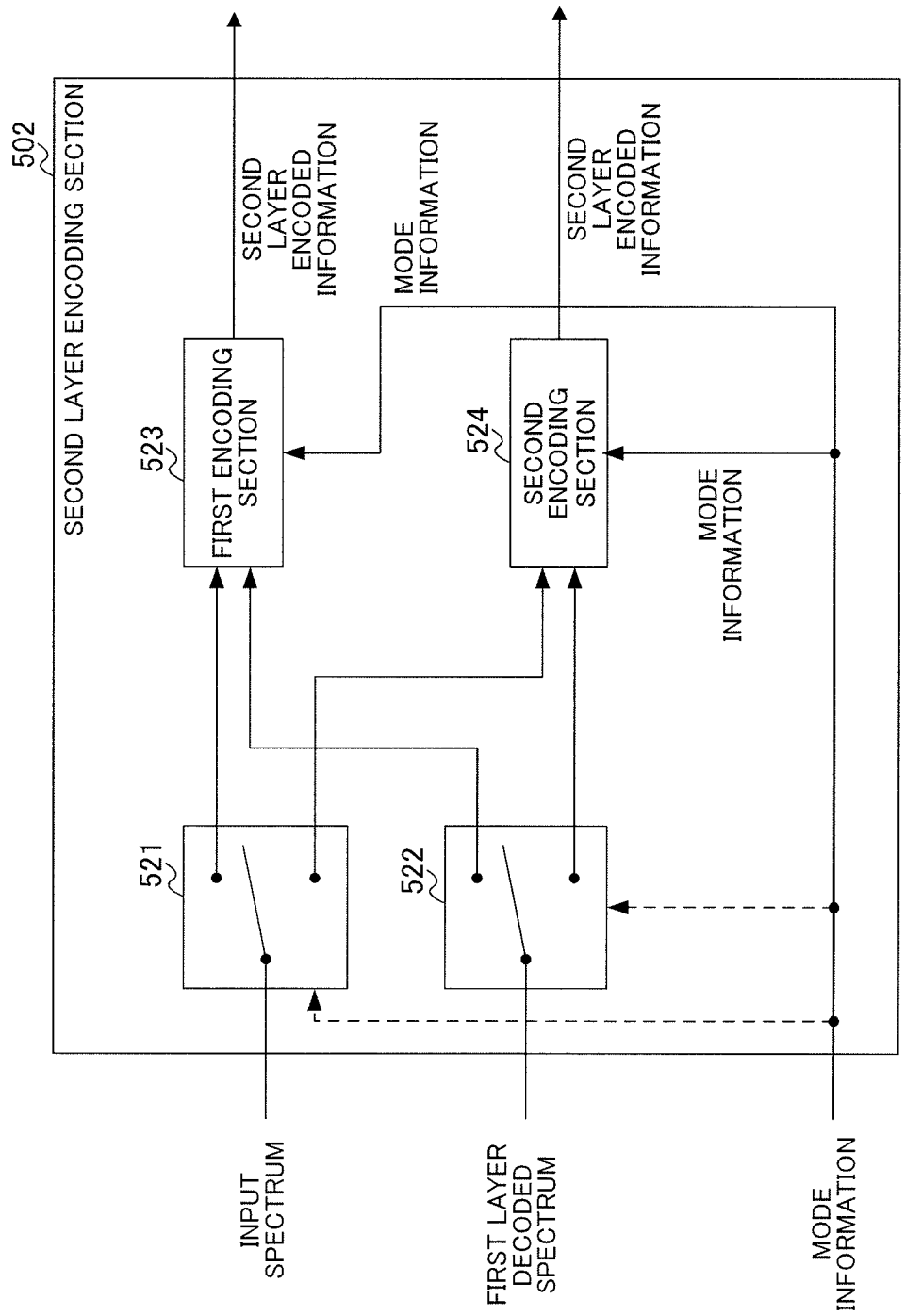
FIG. 15 is a block diagram showing a principal internal configuration of the second layer encoding section shown in FIG. 14 according to Embodiment 2 of the claimed invention.

Next, a principal internal configuration of second layer encoding section 502 shown in FIG. 14 will be described using FIG. 15.

Second layer encoding section 502 is provided with switch 521, switch 522, first encoding section 523, and second encoding section 524.

Switch 521 and switch 522 are controlled according to mode information inputted from mode determination section 501 and respectively output the input spectrum and first layer decoded spectrum to one of first encoding section 523 and second encoding section 524. Arrows shown by broken lines in FIG. 15 refer to a control destination rather than a data flow. For example, switch 521 and switch 522 output the input spectrum and first layer decoded spectrum to first encoding section 523 when the mode information is "mode 1," or outputs the input spectrum and first layer decoded spectrum to second encoding section 524 when the mode information is "mode 2." Thus, switch 521 and switch 522 perform switching control over the output destination of the input spectrum and first layer decoded spectrum according to the mode of the encoding method.

When the mode information is "mode 1," first encoding section 523 generates second layer encoded information using the mode information, input spectrum and first layer decoded spectrum to be inputted. First encoding section 523 outputs the second layer encoded information generated to encoded information integration section 207. In the present embodiment, first encoding section 523 performs processing similar to that in second layer encoding section 206 described in Embodiment 1. The details of the processing of first encoding section 523 will be described, hereinafter.

When the mode information is "mode 2," second encoding section 524 generates second layer encoded information using the mode information, input spectrum and first layer decoded spectrum to be inputted. Second encoding section 524 outputs the second layer encoded information generated to encoded information integration section 207. Second encoding section 524 performs processing using an encoding scheme different from the encoding scheme used in first encoding section 523. In the present embodiment, since the encoding scheme used in second encoding section 524 is not necessarily limited in any particular way, a description thereof will be omitted. However, a configuration adopting an encoding scheme in the "TRANSIENT" mode in G.722-SWB can be taken as an example.

Thus, second layer encoding section 502 includes a plurality of encoding sections (first encoding section 523 and second encoding section 524) for switching between a plurality of encoding methods.

Figure 16:
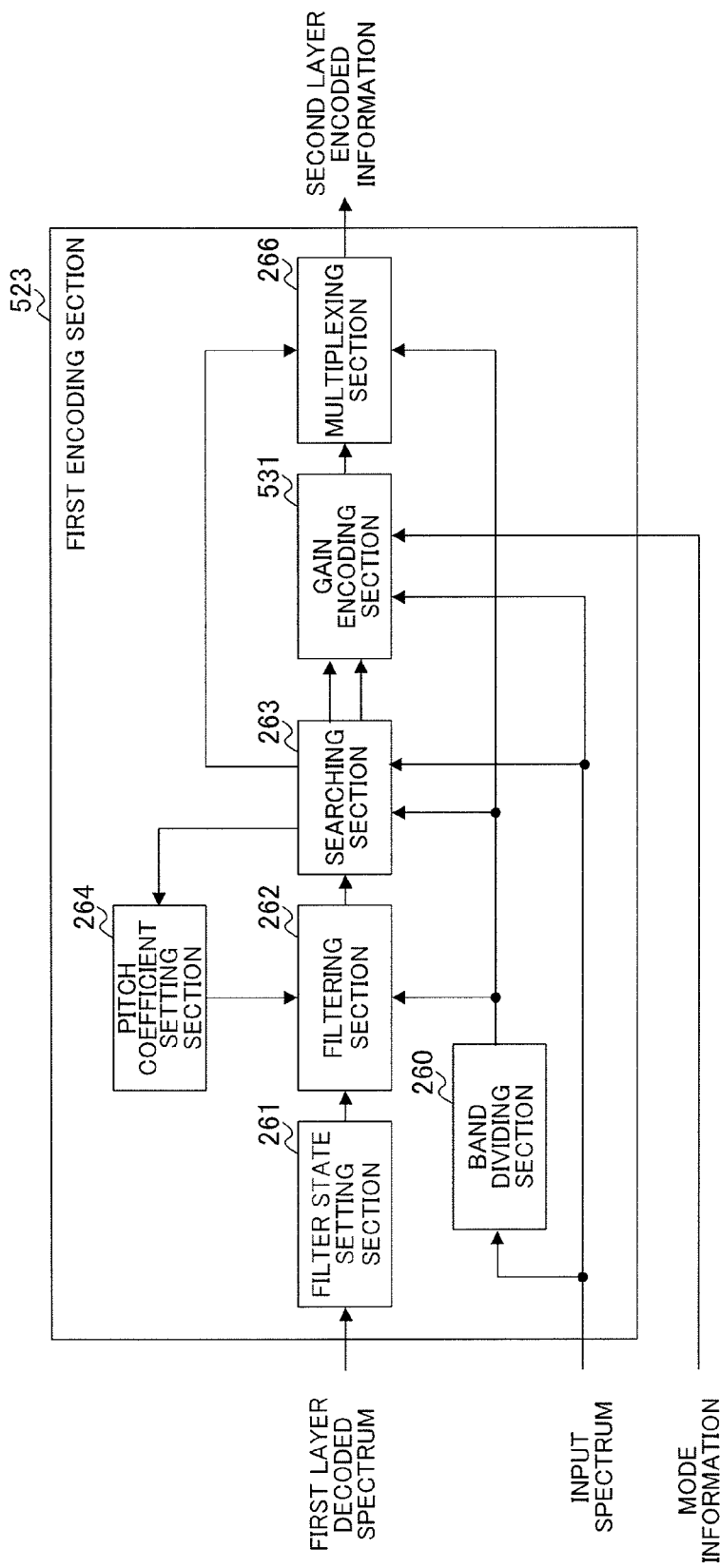
FIG. 16 is a block diagram showing a principal configuration of the first encoding section shown in FIG. 15 according to Embodiment 2 of the claimed invention.

Next, a principal internal configuration of first encoding section 523 shown in FIG. 15 will be described using FIG. 16

First encoding section 523 is provided with band dividing section 260, filter state setting section 261, filtering section 262, searching section 263, pitch coefficient setting section 264, gain encoding section 531 and multiplexing section 266. Since components other than gain encoding section 531 are identical to the components in second layer encoding section 206 (FIG. 3), these components other than gain encoding section 531 will be assigned identical reference numerals and descriptions thereof will be omitted.

Gain encoding section 531 receives the mode information from mode determination section 501 as input. Gain encoding section 531 calculates for each subband, a logarithmic gain which is a parameter for adjusting an energy ratio in a non-linear region based on input spectrum $S2(k)$ and estimated spectrum $S2_p'(k)$ ($p=0, 1, \ldots, P-1$) of each subband inputted from searching section 263 and ideal gain $\alpha 1_p$.

Next, gain encoding section 531 quantizes the ideal gain and logarithmic gain using the mode information and outputs the quantized ideal gain and logarithmic gain to multiplexing section 266. More specifically, gain encoding section 531 includes a memory capable of storing the mode information. The internal configuration of gain encoding section 531 is identical to that of gain encoding section 265 (FIG. 3) except that gain encoding section 531 includes the above-described memory.

When the mode information at the time of previous frame processing that is stored in the memory is different from the mode information inputted in the current frame, i.e., when the encoding method is changed between the current frame and the previous frame (i.e., when second encoding section 524 operates in the previous frame and first encoding section 523 operates in the current frame), gain encoding section 531 applies attenuation processing to ideal gain $\alpha 1_p$ to be quantized according to following equation 31. In this case, $\gamma$ is an attenuation coefficient that satisfies $0<\gamma<1$ and has a predetermined value. Next, gain encoding section 531 quantizes ideal gain $\alpha 1_p'$ multiplied by $\gamma$.

$$\alpha 1_p' = \gamma \cdot \alpha 1_p \text{ (for all } p\text{)} \tag{Equation 31}$$

On the other hand, when the mode information at the time of previous frame processing that is stored in the memory is identical to the mode information inputted in the current frame, that is, when the encoding method is changed between the current frame and the previous frame (i.e., when first encoding section 523 operates in both the previous frame and the current frame herein), gain encoding section 531 does not apply attenuation processing to the ideal gain to be quantized, performs processing similar to that in gain encoding section 265 (FIG. 3) to quantize the gain information. Next, gain encoding section 531 outputs the calculated ideal gain encoded information and the logarithmic gain encoded information to multiplexing section 266.

Thus, when the encoding method is changed between the previous frame and the current frame, first encoding section 523 adjusts the ideal gain used for the encoding method in the current frame. More specifically, when the encoding method is changed between the previous frame and the current frame, first encoding section 523 attenuates the ideal gain used in the current frame.

The processing of first encoding section 523 has been described, hereinabove.

The processing of encoding apparatus 111 according to the present embodiment has been described, hereinabove.

Next, the processing of decoding apparatus 113 according to the present embodiment will be described.

Figure 17:
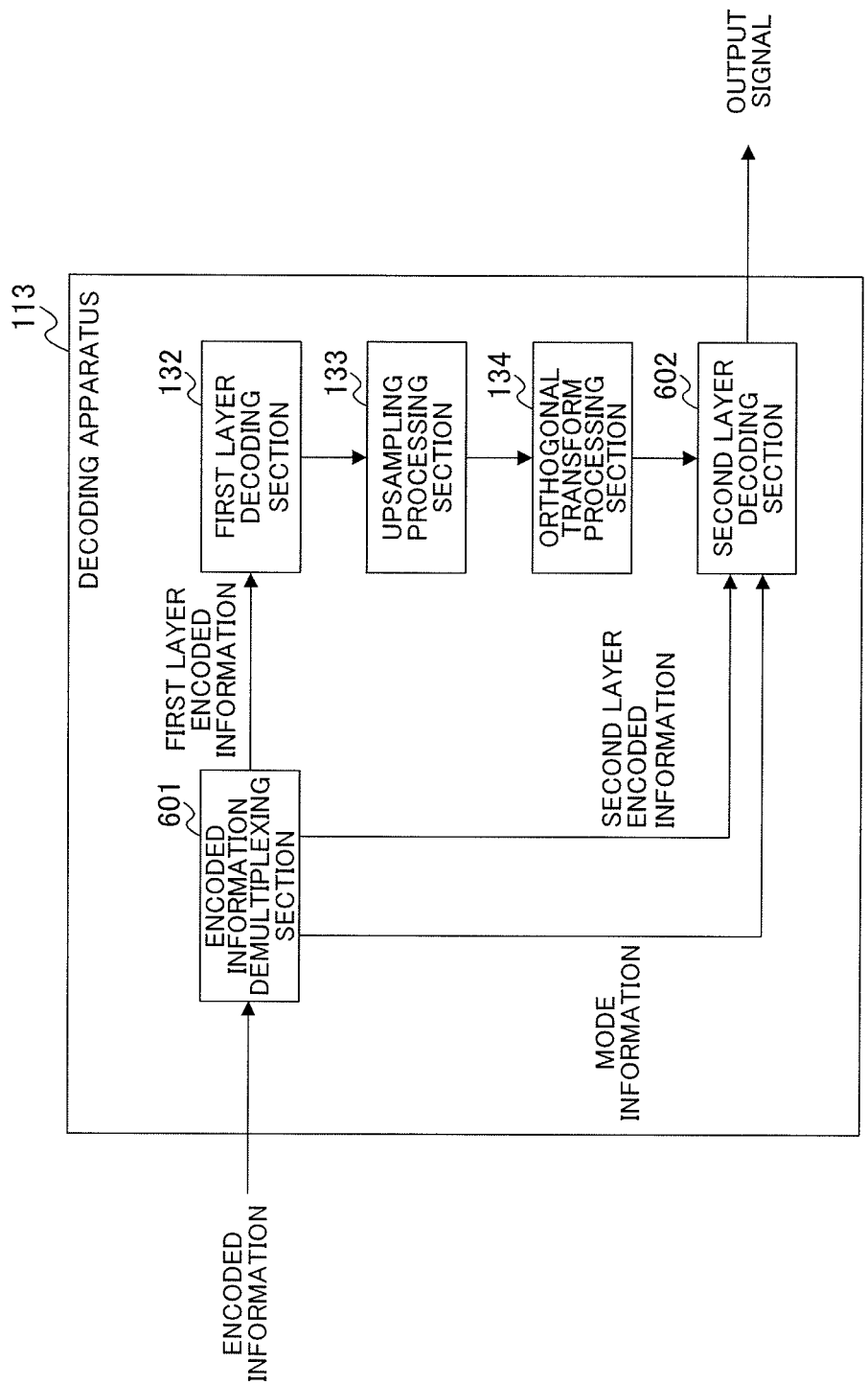
FIG. 17 is a block diagram showing a principal internal configuration of the decoding apparatus shown in FIG. 1 according to Embodiment 2 of the claimed invention.

FIG. 17 is a block diagram showing a principal internal configuration of decoding apparatus 113.

In decoding apparatus 113 shown in FIG. 17, since components other than encoded information demultiplexing section 601 and second layer decoding section 602 are identical to the components in decoding apparatus 103 (FIG. 8) described in Embodiment 1, these components will be assigned identical reference numerals and descriptions thereof will be omitted.

Encoded information demultiplexing section 601 demultiplexes the inputted encoded information (i.e., encoded information received from encoding apparatus 111 (FIG. 14)) into first layer encoded information, second layer encoded information and mode information and outputs the first layer encoded information to first layer decoding section 132 and outputs the second layer encoded information and mode information to second layer decoding section 602.

Second layer decoding section 602 estimates a high-frequency portion of a speech signal from first layer decoded spectrum $S1(k)$ using first layer decoded spectrum $S1(k)$ inputted from orthogonal transform processing section 134 and the second layer encoded information and mode information inputted from encoded information demultiplexing section 601, adjusts the amplitude of the spectral component to generate a second layer decoded signal including the high-frequency component and outputs the second layer decoded signal as an output signal.

Figure 18:
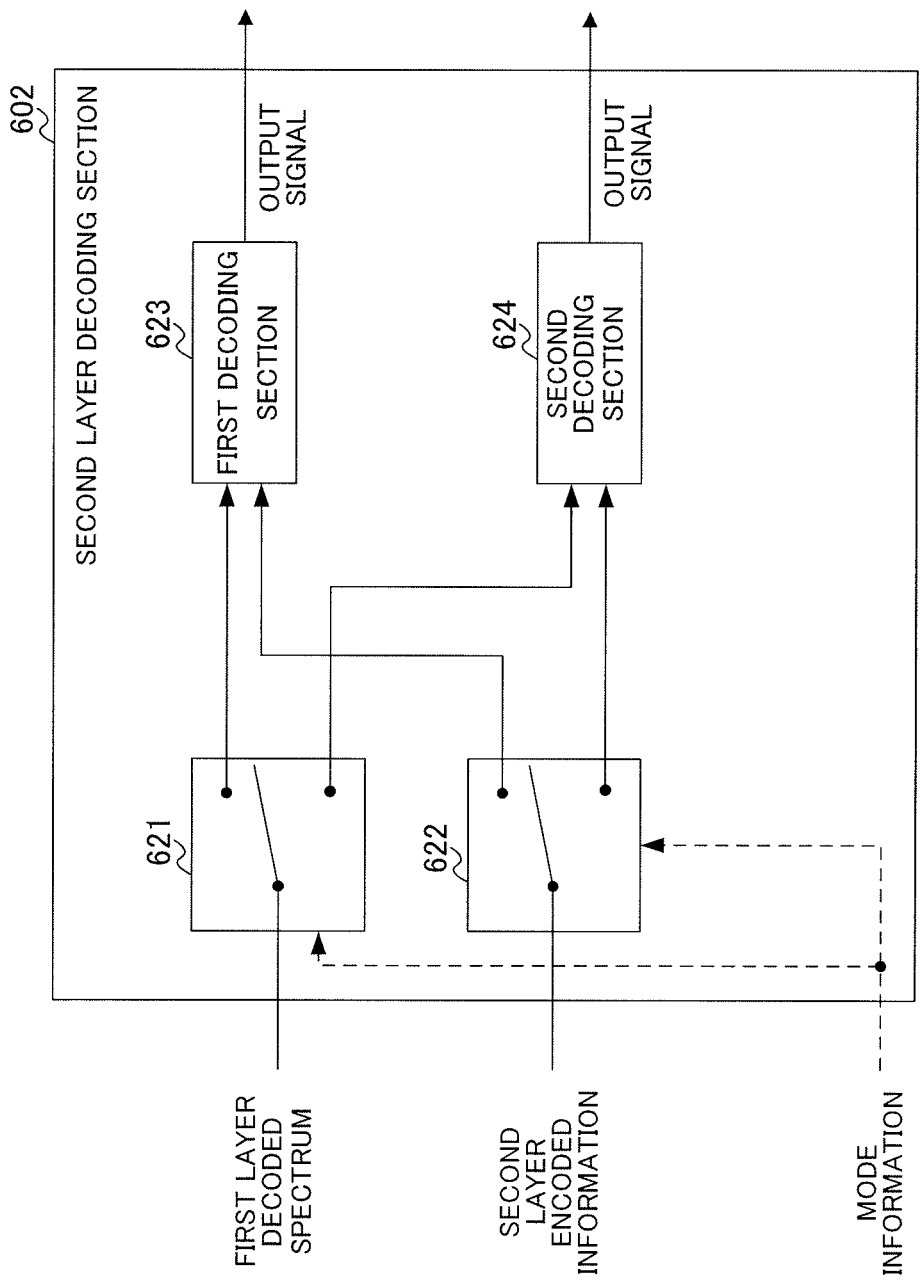
FIG. 18 is a block diagram showing a principal internal configuration of the second layer decoding section shown in FIG. 17 according to Embodiment 2 of the claimed invention.

FIG. 18 is a block diagram showing a principal internal configuration of second layer decoding section 602 shown in FIG. 17.

Second layer decoding section 602 is provided with switch 621, switch 622, first decoding section 623 and second decoding section 624.

Switch 621 and switch 622 are controlled according to the mode information inputted from encoding demultiplexing section 601 and respectively output the first layer decoded spectrum and second layer encoded information to one of first decoding section 623 and second decoding section 624. For example, switch 621 and switch 622 output the first layer decoded spectrum and second layer encoded information to first decoding section 623 when the mode information is "mode 1" and output first layer decoded spectrum and second layer encoded information to second decoding section 624 when the mode information is "mode 2." Thus, switch 621 and switch 622 perform switching control over the output destination of the first layer decoded spectrum and second layer encoded information according to the mode of the decoding method.

When the mode information is "mode 1," first decoding section 623 generates an output signal using the mode information, first layer decoded spectrum and second layer encoded information inputted. First decoding section 623 outputs the output signal generated. Since first decoding section 623 performs processing similar to that of second layer decoding section 135 described in Embodiment 1, descriptions thereof will be omitted in the present embodiment. However, first decoding section 623 is different from second layer decoding section 135 of Embodiment 1 in that the ideal gain encoded information to be decoded is not $\alpha 1_p$, but $\alpha 1'_p$.

When the mode information is "mode 2," second decoding section 624 generates an output signal based on the mode information, first layer decoded spectrum and second layer encoded information to be received. Second decoding section 624 outputs the output signal generated. Second decoding section 624 performs processing using a decoding scheme different from the decoding scheme in first decoding section 623 (i.e., decoding scheme corresponding to the encoding scheme in second encoding section 524). Since the decoding scheme used in second decoding section 624 in the present embodiment is not limited in any particular way, description thereof will be omitted. A configuration adopting a decoding scheme in a "TRANSIENT" mode in G.722-SWB can be taken as an example.

Thus, according to the present embodiment, the encoding apparatus stores the mode information and when the mode information on a previous frame is different from the mode information on a current frame, the encoding section that estimates a spectrum of the high-frequency portion attenuates the gain to be quantized. Accordingly, when the encoding scheme (encoding mode) is changed, it is possible to limit a considerable change in the gain which could cause abnormal sound (particularly a considerable increase in gain having a large perceptual influence) and thereby realize the processing of suppressing the above-described degradation of sound quality. That is, even when there are a plurality of types of encoding or decoding schemes for performing band expansion using a spectrum of the low-frequency portion to estimate the spectrum of the high-frequency portion, i.e., when a multimode encoding or decoding scheme is used, the encoding apparatus limits degradation (abnormal sound) of sound quality that may occur when the mode is changed. Accordingly, the encoding apparatus can provide a decoded signal of high quality while realizing a drastic reduction of the amount of processing.

The present embodiment has described as an example, the processing by the gain encoding section of the encoding apparatus to store mode information at each time of frame processing and attenuate the ideal gain to be quantized, when the mode information is changed. However, the claimed invention is not limited to this example, and is likewise applicable to a configuration in which a gain to be quantized is attenuated using information other than the mode information. One such example can be a configuration in which the encoding apparatus stores frame energy regarding each frame, in addition to mode information at each time of frame processing, and then attenuates the gain to be quantized using the mode information and frame energy. In this configuration, when the mode information on a previous frame is different from the mode information on a current frame, i.e., when the mode information is changed, the encoding apparatus calculates an average value of frame energy of the previous frame and frame energy of the current frame first. Next, the encoding apparatus attenuates or amplifies the gain to be quantized in accordance with the ratio between the calculated average value of frame energy and the frame energy of the current frame. For example, when the frame energy of the previous frame is 10000 and the frame energy of the current frame is 5000, the encoding apparatus multiplies the gain to be quantized by the ratio of 7500 which is an average value of frame energy to the current frame energy, that is, 1.5 (=7500/5000). In this case, since the frame energy ratio (1.5) is equal to or above 1, the processing is not attenuation processing but rather amplification processing. Amplification processing is also made possible by substituting an "attenuation or amplification coefficient" that allows a value equal to or above 1 for attenuation coefficient $\gamma$ ($0<\gamma<1$) in equation 31 through processing similar to that described above. Normally, when the encoding mode is changed, the influence of abnormal sound caused by a drastic increase of gain is perceptually large. Accordingly, the present embodiment has described such a configuration as to suppress degradation of sound quality through relatively simple processing (i.e., processing with a low amount of calculation) against the drastic increase of gain. However, although the amount of calculation processing increases compared to the aforementioned configuration, the change of frame energy (or gain) can be smoothed not only when the frame energy (or gain) drastically increases but also when the frame energy drastically decreases by using the above-described frame energy, in a case where the encoding mode is changed. Therefore, further suppression of degradation of sound quality (abnormal sound) degradation is possible.

Furthermore, the present embodiment has described as an example, a case where an ideal gain is assumed to be a target as gain information for attenuation when the mode information is changed. However, the claimed invention is not limited to this, but is likewise applicable to a configuration in which gain information other than the ideal gain is attenuated (or amplified). For example, a configuration can be taken as an example in which the gain encoding section described in the present embodiment attenuates or amplifies the logarithmic gain information. Furthermore, the gain encoding section may also attenuate or amplify the input spectrum itself which is a quantization target. Moreover, the gain encoding section may also apply attenuation (or amplification) processing to one of the ideal gain, logarithmic gain, input spectrum and the like in the above-described configuration using the ratio of the frame energy of the previous frame to the frame energy of the current frame (i.e., frame energy ratio).

In addition, the present embodiment has described the configuration as an example where the encoding apparatus internally attenuates or amplifies the gain information when the mode information is changed. However, the claimed invention is not limited to this, and is likewise applicable to a configuration in which the decoding apparatus internally attenuates or amplifies the gain information. That is, the decoding apparatus (e.g., the second layer decoding section) may further include a plurality of decoding sections that switch between a plurality of decoding methods in accordance with the mode information and adjust the gain information used at the time of decoding of the current frame when the decoding method is changed between the previous frame and current frame. For example, upon detecting a change in the mode information, the decoding apparatus may perform attenuation/amplification processing on the decoded gain information (i.e., ideal gain or logarithmic gain). Furthermore, the decoding apparatus may also perform attenuation or amplification processing on the decoded spectrum generated using the decoded gain information (i.e., ideal gain and logarithmic gain).

Furthermore, the present embodiment has described as an example, the configuration in which gain information is attenuated using a predetermined attenuation coefficient when the mode information is changed. However, the claimed invention is not limited to this, but is likewise applicable to such a configuration as to calculate an attenuation coefficient with which gain information is adaptively attenuated at each time of frame processing. For example, as described above, the encoding apparatus (or decoding apparatus) may calculate an average value between the frame energy of a previous frame and the frame energy of a current frame and attenuate or amplify the gain information or spectrum using such a coefficient that the frame energy of the current frame becomes close to the calculated average value. That is, the encoding apparatus (or decoding apparatus) may attenuate or amplify the gain information or spectrum used in the current frame using the frame energy of the previous frame.

Alternatively, when the mode information is changed, that is, when the encoding method (i.e., decoding method) is changed between the previous frame and the current frame, the encoding apparatus (or decoding apparatus) may adjust the gain information used in the current frame using the gain information used in the previous frame. For example, when the encoding method (or decoding method) is changed between the previous frame and the current frame, the encoding apparatus (or decoding apparatus) may adjust the gain information used in the current frame so that the gain information used in the current frame becomes close to the gain information used in the previous frame. In this configuration, even when the encoding method (or decoding method) is changed, the encoding apparatus (or decoding apparatus) can use gain information in consideration of the previous frame in the current frame and further limit degradation of sound quality (i.e., abnormal sound) that may occur when the encoding method (or decoding method) is changed.

Furthermore, the present embodiment has described as an example, the configuration where the second layer encoding section of the encoding apparatus is internally provided with two types of encoding schemes. However, the claimed invention is not limited to this, and is likewise applicable to a configuration provided with three or more types of encoding schemes, that is, a configuration adopting a multimode encoding or decoding scheme of three or more types.

Furthermore, the present embodiment has described as an example, the configuration where only the first encoding section in the second layer encoding section of the encoding apparatus attenuates (or amplifies) gain information. However, the claimed invention is not limited to this, and is likewise applicable to a configuration in which attenuation (or amplification) processing is likewise applied to the encoding section other than the first encoding section (e.g., second encoding section). That is, in the multimode encoding or decoding scheme, the processing similar to that of the present embodiment may be applied to encoding/decoding schemes in some modes or to encoding or decoding schemes in all modes.

Although the decoding apparatus according to each embodiment above performs processing using encoded information transmitted from the encoding apparatus according to each embodiment above, the claimed invention is not limited to this, and processing is possible even if the encoded information is not necessarily one that is transmitted from the encoding apparatus according to each embodiment above as long as the encoded information contains necessary parameters or data.

Furthermore, the claimed invention is also applicable to cases where a signal processing program is recorded or written in a machine-readable recording medium such as a memory, disk, tape, CD, or DVD, and operated. In this case as well, operational effects similar to those of the present embodiment can be obtained.

The above embodiment have been described using examples in which the claimed invention is implemented by hardware, the claimed invention can also be realized by software in cooperation with hardware.

Each function block employed in the description of each of the aforementioned embodiments may typically be implemented as an LSI configured as an integrated circuit. These functions may be formed as individual chips or partially or totally contained on a single chip. "LSI" is adopted herein. However, LSI may also be referred to as "IC," "system LSI," "super LSI," or "ultra LSI" depending on differing extents of integration.

Furthermore, the method of circuit integration is not limited to LSI's, and implementation using dedicated circuitry or general purpose processors is also possible. After LSI manufacture, utilization of a programmable field programmable gate array (FPGA) or a reconfigurable processor where connections and settings of circuit cells within the LSI can be reconfigured is also possible.

Furthermore, if integrated circuit technology emerges to replace LSI's as a result of the advancement of semiconductor technology or a derivative from other technology, carrying out function block integration using this emerging technology is also clearly possible. Moreover, an application of biotechnology is also possible.

The disclosure of Japanese Patent Application No. 2010-141021, filed on Jun. 21, 2010, and Japanese Patent Application No. 2011-047597, filed on Mar. 4, 2011, including the specification, drawings and abstract is incorporated herein by reference in its entirety.

INDUSTRIAL APPLICABILITY

The decoding apparatus, encoding apparatus, decoding method and encoding method according to the claimed invention can improve the quality of a decoded signal when performing band expansion of a spectrum of a low-frequency portion to estimate a spectrum of a high-frequency portion, and thus are applicable to a packet communication system, a mobile communication system and/or the like.

REFERENCE SIGNS LIST

101, 111, 400 encoding apparatus
102 transmission path
103, 113 decoding apparatus
201 downsampling processing section
202 first layer encoding section
132, 203 first layer decoding section
133, 204 upsampling processing section
134, 205, 356 orthogonal transform processing section
206, 226, 502 second layer encoding section 207 encoded information integration section
260 band dividing section
261, 352 filter state setting section
262, 353 filtering section
263 searching section
264 pitch coefficient setting section
265, 531 gain encoding section
266 multiplexing section
271 ideal gain encoding section
272 logarithmic gain encoding section
281, 371 maximum amplitude value searching section
282, 372 sample group extraction section
283 logarithmic gain calculation section
131, 601 encoded information demultiplexing section
135, 401, 602 second layer decoding section
351 demultiplexing section
354 gain decoding section
355 spectrum adjusting section
361 ideal gain decoding section
362 logarithmic gain decoding section
373 logarithmic gain application section
374 interpolation processing section
402 third layer encoding section
501 mode determination section
521, 522, 621, 622 switch
523 first encoding section
524 second encoding section
623 first decoding section
624 second decoding section

The invention claimed is:

1. A decoding apparatus, comprising:
a receiving section that receives, using a processor, first encoded information indicating a low-frequency portion no greater than a predetermined frequency of a speech signal to be created or an audio signal to be created, and second encoded information, the second information containing band information for estimating a spectrum of a high-frequency portion of the speech signal to be created or the audio signal to be created in a plurality of subbands obtained by dividing the high-frequency portion higher than the predetermined frequency, and a first amplitude adjusting parameter that adjusts an amplitude corresponding to a part or all of spectral components in each subband;
a first decoding section that decodes, using the processor, the first encoded information to generate a first decoded signal; and
a second decoding section that estimates, using the processor, the high-frequency portion of the speech signal to be created or the audio signal to be created from the first decoded signal using the second encoded information and adjusts the amplitude of the spectral component to thereby generate and output a second decoded signal, wherein
the second decoding section comprises:
a spectral component selection section that selects a part of the spectral components for the spectrum of the estimated high-frequency portion of the speech signal to be created or the audio signal to be created;
a first amplitude adjusting parameter application section that applies a second amplitude adjusting parameter to the selected part of the spectral components;
a second amplitude adjusting parameter application section that applies a third amplitude adjusting parameter adaptively set in accordance with the value of the second amplitude adjusting parameter, to the spectral component that has not been selected, and
an amplitude value searching section that searches for a spectral component having a maximum or minimum amplitude value for the spectrum of the estimated high-frequency portion of the speech signal or the audio signal for each of the subbands,
wherein the spectral component selection section selects a part of the spectral components using a weight factor with which a spectral component closer to the spectral component having the maximum or minimum amplitude value is more easily selected, and
wherein the speech signal or audio signal is created based on the second decoded signal.

2. The decoding apparatus according to claim 1, wherein the second decoding section estimates the spectrum of the high-frequency portion of the speech signal or the audio signal for the spectrum of the first decoded signal using the band information indicating the band of the spectrum of the first decoded signal most approximate to each subband of the spectrum of the high-frequency portion of the speech signal or the audio signal included in the second encoded information, and adjusts the amplitude of the spectral component of the estimated high-frequency portion of the speech signal or the audio signal using the first amplitude adjusting parameter included in the second encoded information.

3. The decoding apparatus according to claim 1, wherein:
the first amplitude adjusting parameter application section adjusts the amplitude in a logarithmic region; and
the second amplitude adjusting parameter application section adjusts the amplitude in a linear region.

4. The decoding apparatus according to claim 1, wherein the second amplitude adjusting parameter application section sets the third amplitude adjusting parameter of a small value when the value of the second amplitude adjusting parameter is smaller than a predetermined threshold, and sets the third amplitude adjusting parameter of a large value when the value of the second amplitude adjusting parameter is no less than the predetermined threshold.

5. The decoding apparatus according to claim 1, wherein:
the receiving section further receives mode information indicating a decoding method in accordance with characteristics of the speech signal or the audio signal;
the second decoding section further comprises a plurality of decoding sections that switch between a plurality of decoding methods in accordance with the mode information; and
the plurality of decoding sections adjust a first gain used in decoding of a current frame when the decoding method is changed between a previous frame and the current frame, and the first gain is the first amplitude parameter or the second amplitude parameter.

6. The decoding apparatus according to claim 5, wherein when the decoding method is changed between the previous frame and the current frame, the plurality of decoding sections attenuate the first gain used in the current frame.

7. The decoding apparatus according to claim 5, wherein when the decoding method is changed between the previous frame and the current frame, the plurality of decoding sections adjust the first gain used in the current frame, by using a second gain used in decoding of the previous frame, and the second gain is the first amplitude parameter or the second amplitude parameter.

8. The decoding apparatus according to claim 5, wherein when the decoding method is changed between the previous frame and the current frame, the plurality of decoding sections adjust the first gain so that the first gain used in the current frame becomes close to the second gain used in decoding of the previous frame, and the second gain is the first amplitude parameter or the second amplitude parameter.

9. A communication terminal apparatus comprising the decoding apparatus according to claim 1.

10. A base station apparatus comprising the decoding apparatus according to claim 1.

11. An encoding apparatus, comprising:
a first encoding section that encodes, using a processor, a low-frequency portion no greater than a predetermined frequency of an input speech or audio signal to generate first encoded information;
a decoding section that decodes, using the processor, the first encoded information to generate a first decoded signal;
a second encoding section that generates, using the processor, second encoded information containing band information for estimating a spectrum of a high-frequency portion of the input speech or audio signal in a plurality of subbands obtained by dividing the high-frequency portion higher than the predetermined frequency, and a first amplitude adjusting parameter that adjusts an amplitude corresponding to a part or all of spectral components in each subband;
a second decoding section that estimates, using the processor, the high-frequency portion of the input speech or audio signal from the first decoded signal using the second encoded information and adjusts the amplitude of the spectral component to thereby generate a second decoded signal;
a third encoding section that encodes, using the processor, a difference signal between the first decoded signal and the second decoded signal, and the input speech or audio signal, to generate third encoded information, and
a multiplexing section, using the processor, that multiplexes the first encoded information, the second encoded information, and the third encoded information, and outputs to a transmission channel as an encoded information,
wherein
the second decoding section comprises:
a spectral component selection section that selects a part of the spectral components for the spectrum of the estimated high-frequency portion of the input speech or audio signal;
a first amplitude adjusting parameter application section that applies a second amplitude adjusting parameter to the selected part of the spectral components;
a second amplitude adjusting parameter application section that applies a third amplitude adjusting parameter adaptively set in accordance with the value of the second amplitude adjusting parameter to the spectral components that has not been selected, and
an amplitude value searching section that searches for a spectral component having a maximum or minimum amplitude value for the spectrum of the estimated high frequency portion of the input speech or audio signal for each of the subbands,
wherein the spectral component selection section selects a part of the spectral components using a weight factor with which a spectral component closer to the spectral component having the maximum or minimum amplitude value is more easily selected, and
wherein the input speech or audio signal can be created based on the second decoded signal.

12. The encoding apparatus according to claim 11, wherein:
the first amplitude adjusting parameter application section adjusts the amplitude in a logarithmic region; and
the second amplitude adjusting parameter application section adjusts the amplitude in a linear region.

13. The encoding apparatus according to claim 11, wherein the second amplitude adjusting parameter application section sets the third amplitude adjusting parameter of a small value when the value of the second amplitude adjusting parameter is smaller than a predetermined threshold, and sets the third amplitude adjusting parameter of a large value when the value of the second amplitude adjusting parameter is no less than the predetermined threshold.

14. The encoding apparatus according to claim 11, wherein:
the second encoding section further comprises a plurality of encoding sections that switch between a plurality of encoding methods according to characteristics of the input speech or audio signal; and
when the encoding method is changed between a previous frame and a current frame, the plurality of encoding sections adjust a first gain used in encoding of the current frame, and the first gain is the first amplitude parameter or the second amplitude parameter.

15. The encoding apparatus according to claim 14, wherein when the encoding method is changed between the previous frame and the current frame, the plurality of encoding sections attenuate the first gain used in the current frame.

16. The encoding apparatus according to claim 14, wherein when the encoding method is changed between the previous frame and the current frame, the plurality of encoding sections adjust the first gain used in the current frame, by using a second gain used in encoding of the previous frame, and the second gain is the first amplitude parameter or the second amplitude parameter.

17. The encoding apparatus according to claim 14, wherein when the encoding method is changed between the previous frame and the current frame, the plurality of encoding sections adjust the first gain so that the first gain used in the current frame becomes close to the second gain used in encoding of the previous frame, and the second gain is the first amplitude parameter or the second amplitude parameter.

18. A communication terminal apparatus comprising the encoding apparatus according to claim 11.

19. A base station apparatus comprising the encoding apparatus according to claim 11.

20. A decoding method, comprising:
receiving, executed by a processor, first encoded information indicating a low-frequency portion no greater than a predetermined frequency of a speech signal to be created or an audio signal to be created, and second encoded information, the second encoded information containing band information for estimating a spectrum of a high-frequency portion of the speech signal to be created or the audio signal to be created in a plurality of subbands obtained by dividing the high-frequency portion higher than the predetermined frequency, and a first amplitude adjusting parameter that adjusts an amplitude corresponding to a part or all of spectral components in each subband;
decoding, executed by the processor, the first encoded information to generate a first decoded signal; and
estimating, executed by the processor, the high-frequency portion of the speech signal to be created or the audio signal to be created from the first decoded signal using the second encoded information and adjusting the amplitude of the spectral component to thereby generate and output a second decoded signal, wherein
the estimating comprises:
- selecting a part of the spectral components for the spectrum of the estimated high-frequency portion of the speech signal to be created or the audio signal to be created;
- applying a second amplitude adjusting parameter to the selected part of the spectral components;
- applying a third amplitude adjusting parameter adaptively set in accordance with the value of the second amplitude adjusting parameter, to the spectral components that has not been selected, and
- searching for a spectral component having a maximum or minimum amplitude value for the spectrum of the estimated high-frequency portion of the speech signal or the audio signal for each of the subbands, wherein the selecting a part of the spectral component uses a weight factor with which a spectral component closer to the spectral component having the maximum or minimum amplitude value is more easily selected, and wherein the speech signal or audio signal is created based on the second decoded sig.

21. An encoding method, comprising:
- encoding, executed by a processor, a low-frequency portion no greater than a predetermined frequency of an input speech or audio signal to generate first encoded information;
- decoding, executed by the processor, the first encoded information to generate a first decoded signal;
- generating, executed by the processor, second encoded information containing band information for estimating a spectrum of a high-frequency portion of the input speech or audio signal in a plurality of subbands obtained by dividing the high-frequency portion higher than the predetermined frequency, and a first amplitude adjusting parameter that adjusts an amplitude corresponding to a part or all of spectral components in each subband;
- estimating, executed by the processor, the high-frequency portion of the input speech or audio signal from the first decoded signal using the second encoded information and adjusting the amplitude of the spectral component to thereby generate a second decoded signal;
- encoding, executed by the processor, a difference signal between the first decoded signal and the second decoded signal, and the input speech or audio signal, to generate third encoded information, and
- multiplexing, executed by the processor, the first encoded information, the second encoded information, and the third encoded information, and outputting to a transmission channel as an encoded information, wherein the estimating comprises:
- selecting a part of the spectral components for the spectrum of the estimated high-frequency portion of the input speech or audio signal;
- applying a second amplitude adjusting parameter to the selected part of the spectral components;
- applying a third amplitude adjusting parameter adaptively set in accordance with the value of the second amplitude adjusting parameter to the spectral component that has not been selected, and
- searching for a spectral component having a maximum or minimum amplitude value for the spectrum of the estimated high-frequency portion of the input speech or audio signal for each of the subbands, wherein the selecting a part of the spectral components comprises selecting a part of the spectral components using a weight factor with which a spectral component closer to the spectral component having the maximum or minimum amplitude value is more easily selected, and wherein the input speech or audio signal can be created based on the second decoded signal.

* * * * *